United States Patent
Bashir et al.

(10) Patent No.: US 10,008,980 B2
(45) Date of Patent: Jun. 26, 2018

(54) WIDEBAND DIGITALLY CONTROLLED INJECTION-LOCKED OSCILLATOR

(71) Applicants: Imran Bashir, Santa Barbara, CA (US); Robert Bogdan Staszewski, Dublin (IE)

(72) Inventors: Imran Bashir, Santa Barbara, CA (US); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days. days.

(21) Appl. No.: 14/874,410

(22) Filed: Oct. 3, 2015

(65) Prior Publication Data
US 2016/0099720 A1    Apr. 7, 2016

Related U.S. Application Data

(60) Provisional application No. 62/059,415, filed on Oct. 3, 2014.

(51) Int. Cl.
*H03B 5/08*    (2006.01)
*H03B 5/12*    (2006.01)
(Continued)

(52) U.S. Cl.
CPC ........... *H03B 5/1212* (2013.01); *H03B 5/124* (2013.01); *H03B 5/1215* (2013.01);
(Continued)

(58) Field of Classification Search
CPC ..... H03L 7/0991; H03L 7/081; H03L 7/1976; H03B 5/1281; H03B 5/1293;
(Continued)

(56) References Cited

U.S. PATENT DOCUMENTS

| | | | |
|---|---|---|---|
| 7,372,337 B2 * | 5/2008 | Nayler | H03L 7/06 327/156 |
| 7,667,550 B2 * | 2/2010 | Palma | H03B 5/04 331/16 |

(Continued)

OTHER PUBLICATIONS

Staszewski, R.B. et al., "Just-In-Time Gain Estimation of an RF DCO for Digital Direct Frequency Modulation", IEEE Trans. Circ Syst,vol. 50,No. 11, No. 11, pp. 887-892, Nov. 2003.
(Continued)

*Primary Examiner* — Richard Tan
(74) *Attorney, Agent, or Firm* — Howard Zaretsky; Zaretsky Group PC

(57) ABSTRACT

A novel and useful digitally controlled injection-locked RF oscillator with an auxiliary loop. The oscillator is injection locked to a time delayed version of its own resonating voltage (or its second harmonic) and its frequency is modulated by manipulating the phase and amplitude of injected current. The oscillator achieves a narrow modulation tuning range and fine step size of an LC tank based digitally controlled oscillator (DCO). The DCO first gets tuned to its center frequency by means of a conventional switched capacitor array. Frequency modulation is then achieved via a novel method of digitally controlling the phase and amplitude of injected current into the LC tank generated from its own resonating voltage. A very linear deviation from the center frequency is achieved with a much lower gain resulting in a very fine resolution DCO step size and high linearity without needing to resort to oversampled noise shaped dithering.

20 Claims, 23 Drawing Sheets

(51) Int. Cl.
*H03L 7/081* (2006.01)
*H03L 7/099* (2006.01)
*H03L 7/197* (2006.01)

(52) U.S. Cl.
CPC ......... *H03B 5/1228* (2013.01); *H03B 5/1265* (2013.01); *H03B 5/1281* (2013.01); *H03B 5/1293* (2013.01); *H03B 5/1296* (2013.01); *H03L 7/081* (2013.01); *H03L 7/0991* (2013.01); *H03L 7/1976* (2013.01); *H03J 2200/10* (2013.01)

(58) Field of Classification Search
CPC .. H03B 5/1212; H03B 5/1296; H03B 5/1215; H03B 5/124; H03B 5/1265; H03B 5/1228; H03J 2200/10
USPC ...... 331/1 R, 12, 23, 34, 37, 117 R, 117 FE, 331/167
See application file for complete search history.

(56) References Cited

U.S. PATENT DOCUMENTS

| | | | | |
|---|---|---|---|---|
| 8,044,734 | B2* | 10/2011 | Lane | H04B 1/0475 331/135 |
| 8,797,105 | B2 | 8/2014 | Afshari et al. | |
| 8,810,329 | B2* | 8/2014 | Sinoussi | H03B 5/08 331/117 R |
| 2010/0164561 | A1* | 7/2010 | Roberg | H03L 7/087 327/117 |
| 2010/0283665 | A1 | 11/2010 | Bashir et al. | |
| 2010/0315170 | A1* | 12/2010 | Locascio | H03B 5/30 331/15 |
| 2014/0132362 | A1* | 5/2014 | Hsiao | H03B 5/364 331/109 |

OTHER PUBLICATIONS

Razavi, B., "A Study of Injection Locking and Pulling in Oscillators", IEEE JSSC, vol. 39, No. 9, pp. 1415-1424, Sep. 2004.
Staszewski, R.B. et al., "All-Digital TX Frequency Synthesizer and Discrete-Time Receiver for Bluetooth Radio in 130-nm CMOS", IEEE JSSC, vol. 39, No. 12, pp. 2278-2291,Dec. 2004.
Staszewski, R.B. et al.,"Phase-Domain All-Digital Phase-Locked Loop", IEEE Trans Circ and Syst., vol. 52, No. 3, pp. 159-163, Mar. 2005.
Staszewski, R.B. et al.,"A Digitally Controlled Oscillator in a 90 nm Digital CMOS Process for Mobile Phones", IEEE JSSC, vol. 40, No. 11, pp. 2203-2211, Nov. 2005.
Staszewski, R. et al., "Software Assisted Digital RF Processor for Single-Chip GSM Radio in 90 nm CMOS", IEEE CICC 2006, pp. 81-84, 2006.
Akhtar, S. et al., "Quad Band Digitally Controlled Oscillator for WCDMA Transmitter in 90nm CMOS", IEEE CICC 2006, pp. 129-132, 2006.
Heidari, M.E. et al., "All-Digital Outphasing Modulator for a Software-Defined Transmitter", IEEE JSSC, vol. 44, No. 4, pp. 1260-1271, Apr. 2009.
Fanori, L. et al., "Capacitive Degeneration in LC-Tank Oscillator for DCO Fine-Frequency Tuning", IEEE JSSC, vol. 45, No. 12, pp. 2737-2745, Dec. 2010.
Kodama, K. et al., "A High Frequency Resolution Digitally-Controlled Oscillator Using Single-Period Switching Scheme", ESSCIRC 2011, pp. 399-402, 2011.
Staszewski, R.B. et al., "Spur-Free All-Digital PLL in 65nm for Mobile Phones", ISSCC 2011, pp. 52-54, 2011.
Staszewski, R.B. et al., "Spur-Free Multirate All-Digital PLL for Mobile Phones in 65 nm CMOS", IEEE JSSC, vol. 46, No. 12, pp. 2904-2919, Dec. 2011.
Adnan, M. et al., "A 105GHz VCO with 9.5% Tuning Range and 2.8mW Peak Output Power Using Coupled Colpitts Oscillators in 65nm Bulk CMOS", IEEE RFIC 2013, pp. 239-242, 2013.
Mirzaei, A. et al., "Analysis of Oscillators Locked by Large Injection Signals: Generalized Adler's Equation and Geometrical Interpretation", IEEE CICC 2006, pp. 737-740,2006.
Heidari, M.E. et al., "Behavioral Models of Frequency Pulling in Oscillators", IEEE Behavioral Modeling and Simulation Workshop 2007, pp. 100-104, 2007.
Hung, C.M. et al., "A Digitally Controlled Oscillator System for SAW-Less Transmitters in Cellular Handsets", IEEE JSSC, vol. 41, No. 5, pp. 1160-1170, May 2006.
Niknejad, A.M., "Injection Locking", PowerPoint Presentation EECS 242, Lecture 26, pp. 1-45, Undated.
Finateu, T. et al., "GMSK Modulation of Subharmonic Injection Locked Oscillators", IEEE ESSCIRC 2005, pp. 101-104, 2005.
Elliott, M. et al., "A Polar Modulator Transmitter for EDGE", IEEE ISSCC 2004, pp. 190-522 vol. 1, 2004.
Adler, R., "A Study of Locking Phenomena in Oscillators", Proc IRE, vol. 34, No. 6, pp. 351-357, 1946.
Tousi, Y.M. et al., "A Novel CMOS High-Power Terahertz VCO Based on Coupled Oscillators: Theory and Implementation", IEEE JSSC, vol. 47, No. 12, pp. 3032-3042, Dec. 2012.
Visweswaran, A. et al., "Fine Frequency Tuning using Injection-Control in a 1.2V 65nm CMOS Quadrature Oscillator", IEEE RFIC 2012, pp. 293-296, 2012.
Zhuang, J. et al., "A 3.3 GHz LC-Based Digitally Controlled Oscillator with 5kHz Frequency Resolution", IEEE Asian SSCC 2007, pp. 428-431, No. 2007.

* cited by examiner

WIDEBAND DIGITALLY CONTROLLED INJECTION-LOCKED OSCILLATOR

REFERENCE TO PRIORITY APPLICATION

This application claims priority to U.S. Provisional Application Ser. No. 62/059,415, filed Oct. 3, 2014, entitled "Oscillators," incorporated herein by reference in its entirety.

FIELD OF THE INVENTION

The present invention relates generally to oscillator circuits and in particular to a wideband digitally controlled injection-locked oscillator having fine precision and wide and linear frequency tuning range.

BACKGROUND OF THE INVENTION

RF frequency modulation that is wideband (WB), linear and of fine precision, while consuming low power, is an area of intensive research. It is used in many applications, including cellular mobile polar transmitters. The principal advantage of polar transmitters over the conventional IQ transmitters is power efficiency since the information signal at the power amplifier input has a constant envelope and therefore can be efficiently processed by a highly compressed non-linear amplifier. The amplitude modulation, in this case, can be generated by modulating the amplifier's bias or a number of active MOS switches.

Polar transmitters, however, suffer from a unique set of challenges. The frequency modulated (FM) clock is generated by the phase-lock loop (PLL), whose frequency is controlled by analog voltage on a varactor or a digitally controlled capacitor in the LC-tank. Irrespective of the implementation, the frequency gain as a function of the input control (continuous or discrete) has to be precisely known or, better yet, constant over the entire FM range for a distortion-free transmission. The existing polar transmitters work reasonably well for narrow-band (NB) modulation schemes, such as GMSK and 8PSK (EDGE). This is not the case, however, for WB modulated signals, which have large frequency excursions near zero-crossings in the IQ constellation. If the FM signal is discrete-time then the FM excursions will be as high as $\pm f_s/2$, where $f_s$ is the sampling rate of the FM signal at the modulator input. Such wide bandwidth signals impose another challenge in discrete FM modulators or digital-to-frequency converters (DFC), which has to do with quantization and linear FM range.

There is thus a need for a low power digitally controlled oscillator (DCO) capable of wideband frequency modulation having fine precision suitable for use in a digital polar transmitter. Designing a DCO to synthesize wideband FM signals such as WCDMA and LTE poses two main challenges: (1) linearity of the DCO transfer function, and (2) resolution of the DCO over the entire FM range. Meeting these constraints in an RF oscillator with switched capacitor array implementation is difficult because of the inherent nonlinear resonant frequency versus tank capacitance curve over a wide frequency range. In addition, such implementations, depending on the desired FM tuning range, requires a large number of unit cells in the capacitor bank which would increase routing complexity and would also impact the Q-factor of the LC tank.

SUMMARY OF THE INVENTION

The present invention is a digitally controlled injection-locked RF oscillator with an auxiliary loop as an alternative to the conventional capacitive tuning of an LC-tank. The oscillator can be programmed to be wideband with a linear tuning range of up to 200 MHz or it can reach a very fine step size as low as 9 kHz at 4 GHz. The oscillator is injection locked to a time delayed version of its resonating voltage and its frequency is modulated by manipulating the phase and amplitude of injected current.

The invention provides a method to achieve a narrow modulation tuning range and fine step size of an LC tank based digitally controlled oscillator (DCO). The DCO first gets tuned to its center frequency by means of a conventional switched capacitor array. Then, frequency modulation is achieved via a novel method of digitally controlling the phase and amplitude of injected current into the LC tank generated from its own resonating voltage. In this manner, a very linear deviation from its center frequency is achieved with a much lower gain resulting in a DCO step size of the finest known resolution and linearity without resorting to oversampled noise shaped dithering.

Alternatively, the system can be configured in wideband mode for application in wideband digital polar transmitter architectures. The measured injection strength and linear tuning range makes the self injection locking technique of the present invention a viable means of generating frequency modulation for various wireless applications. For example, the oscillator can be incorporated within a wide range of circuit applications, including for example a conventional phase locked loop (PLL), all-digital phase-locked loop (AD-PLL), wireline transceiver circuits and mobile devices.

The frequency generator of the present invention is operative to perform DCO frequency modulation through injection locking. The generated oscillator signal is injected with a phase delayed version of itself. The frequency of the injection locked oscillator $\omega_{out}$ under such conditions is given by the well-known Adler's equation, which is tuned by manipulating the phase of the injected signal. Within a reasonable range of θ around 0°, $\omega_{out}$ increases linearly with θ. The phase adjustment of the injected signal is performed in two steps. The first step is a coarse phase adjustment performed by a phase generator block. This block also generates approximately quadrature signals that are used by a digital phase rotator (DPR) to perform fine phase adjustment.

The DPR generates two orthogonal currents $I_{inj1}$ and $I_{inj2}$ that are injected directly into the oscillator core while interpolation is performed by the LC tank of the DCO such that $I_{inj}$ (the Euclidean vector sum of $I_{inj1}$ and $I_{inj2}$) is injected at a phase θ with respect to the DCO current $I_{osc}$. The fine phase adjustment varies θ from −45° to +45° about a mean phase that is determined by the coarse phase adjustment and is typically set to 0°. The signals used to steer injected currents are derived from the DCO. The interpolated phase is a function of the ratio of currents $I_{inj1}$ and $I_{inj2}$ which is controlled by a pair of digital codes a and b. The magnitude of the injected current $I_{inj}$ is controlled by the unit cell current $I_u$ and digital codes a and b. The linear frequency modulation range is determined by the injection locking range which is proportional to the ratio of $I_{inj}$ to the oscillator peak current $I_{osc}$. Both $I_{osc}$ and $I_{inj}$ are digitally controlled and therefore the DCO gain (Hz/LSB) and the linear FM tuning range can be scaled according to the desired application.

There is thus provided in accordance with the invention, a frequency modulator circuit, comprising a frequency oscillator incorporating a tank circuit and operative to generate a resonating waveform, a delay circuit coupled to the frequency oscillator and operative to generate a delayed version of the resonating waveform, a feedback loop coupled to the frequency oscillator and the delay circuit, the feedback loop operative to inject the delayed resonating waveform back into the tank circuit, and wherein the modulator circuit frequency is determined by a duration the resonating waveform is delayed by the delay circuit.

There is also provided in accordance with the invention, a method of generating an oscillating signal, comprising generating a resonating waveform utilizing an LC tank circuit, delaying the resonating waveform to generate a delayed version of the resonating waveform therefrom, injecting the delayed version of the resonating waveform into the tank circuit to modify the frequency of the resonating waveform, and wherein the oscillator signal frequency is determined by the time the resonating waveform is delayed.

There is further provided in accordance with the invention, an oscillator circuit, comprising a digitally controlled oscillator (DCO) incorporating an LC tank circuit and operative to generate a resonating waveform, a phase generator for operative to generate a coarse delayed version of the resonating waveform, a digital phase rotator (DPR) circuit operative to generate a fine delayed version of the resonating waveform by interpolating the delayed version of the resonating waveform, a feedback loop coupled to the digitally controlled oscillator and the digital phase rotator circuit, the feedback loop operative to inject the fine delayed version of the resonating waveform back into the tank circuit, and wherein the oscillator circuit frequency is determined by the duration the resonating waveform is delayed by the phase generator and the digital phase rotator circuit.

BRIEF DESCRIPTION OF THE DRAWINGS

The invention is herein described, by way of example only, with reference to the accompanying drawings, wherein:

FIG. 9A is a block diagram illustrating an example digital phase rotator (DPR) circuit and signal flow for the current control word a;

DETAILED DESCRIPTION OF THE INVENTION

Digital to Frequency Converters

In an example embodiment, a high-performance DFC system comprises a digitally controlled oscillator (DCO) where the frequency is modulated by digitally controlling the LC-tank capacitance C. This architecture splits the tracking tuning word, which controls the finest capacitor bank, into integer and fractional parts. The integer part comprises an array of unit-weighted MOS capacitors (unit cells) selected by thermometer row and column decoders. The integer tuning word drives these capacitors directly, after the binary-to-thermometer encoding, while the fractional tuning word is input to a multi-stage noise shaping (MASH) ΣΔ modulator, which drives one or several unit cells in the capacitor array. The FM tuning range is 5 MHz at 4 GHz while the finest frequency step size without and with ΣΔ is 40 kHz and 200 Hz, respectively, given the 8-bit fractional tuning word input to the ΣΔ and an OSR≥16.

In the above switched capacitor implementations, the challenging aspect is keeping the DCO quantization noise low while achieving moderately wide linear FM range. One approach in addressing this challenge is to increase the number of smallest capacitor cells in the array. This complicates the array implementation because increasing the matrix size requires high-order decoders, which in turn would increase routing complexity and would also impact the Q of the LC-tank.

Another approach is to increase the unit cell size while shifting the quantization noise away from the carrier into far-out frequencies using a ΣΔ modulator. In this scenario, the peak of the quantization noise ("noise bump") at the DCO output is located at $f_{\Sigma\Delta}/2$ which is half the ΣΔ clock frequency. This noise bump may end up in the receive band or, worst case, at the duplex receiver channel if implemented for a full duplex system, and therefore will limit the local receiver sensitivity. Because the noise bump increases with the unit cell or the smallest capacitor size, this issue will only get exacerbated.

One solution to this challenge is to apply pulse width modulation (PWM) to the capacitor on/off control signal. In this topology, the effective capacitance seen by the LC tank can be reduced by controlling the duty cycle of the control signal. This architecture can achieve wider FM tuning range with fewer cells in the capacitor array, thus reducing the impact on Q of the LC tank while the extra resolution gained with the PWM scheme can eliminate the need for a ΣΔ dithering of the unit capacitor. The reported frequency resolution of 270 kHz, however, is not adequate for most wireless applications.

Figure 1:
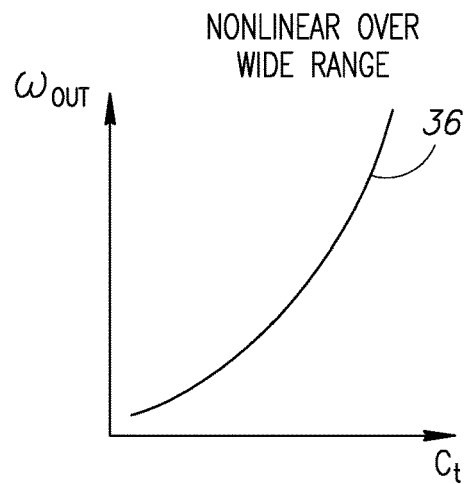
FIG. 1 is a diagram illustrating an example nonlinear oscillator tuning range.

A resolution finer than 1 kHz can be achieved without ΣΔ dithering through capacitive degeneration. Increasing the FM tuning range penalizes the DCO phase noise, however, which also suffers from the increase in the size of the capacitor array. In addition, the DCO transfer function is highly nonlinear over the usable FM range, such as shown in FIG. 1. The minimum frequency step size is 150 Hz while total the tuning range is 12 MHz.

In another embodiment, reasonable DFC quantization and total FM range is achieved through segmented capacitor banks. In this embodiment, the capacitor bank for FM is split into three segments. The most significant bit (MSB) of the coarse segment consists of 128 thermometer coded capacitors each having a step size of 1.95 MHz/LSB. These capacitors are laid out in a 16 by 8 array and cover a frequency range of 250 MHz. The next segment has 16 thermometer coded elements that are $\frac{1}{16}^{th}$ the size of the coarse unit cell and therefore have a step size of 120 kHz/LSB. The last segment has three additional capacitors driven by a 6-bit MASH ΣΔ to increase the resolution of the frequency modulator to 1.875 kHz. Although this embodiment provides a DCO capable of achieving wide FM range, it also exhibits high differential non-linearity (DNL) among capacitors and between coarse and fine segments of the capacitor banks. If not designed properly, the DCO frequency step can be non-monotonic (or overlap) over the segment boundary. All these impairments will impact the spectral purity of the FM signal.

The differential non-linearity (DNL) issue between the coarse and fine capacitor banks is addressed in an embodiment that is a variant of a switched-capacitor array implementation which uses incrementally sized capacitors instead of binary or thermometer weighted capacitors. This topology uses one-hot coding in the fine capacitor bank to select only one capacitor at a time. The capacitor bank comprises 32 unit cells with capacitance of $C_0+i \cdot \Delta C$ and transistor size of $W_0+i \cdot \Delta W$ where i is the capacitor index. The limit on the smallest transistor size $W_0$ is far stringent than the limit on the increment to a transistor size $\Delta W$ and therefore the capacitor bank can be designed to achieve a very small step size. The coarse capacitor bank is also designed by incrementally changing capacitance in the LC-tank by a factor $N \cdot \Delta C$. Therefore, between the consecutive tuning codes, the capacitance increases monotonically and any discontinuity or overlap between the coarse and fine bank is avoided. The fine frequency step size is 5 kHz with a total tuning range of 10.24 MHz. Although the fine frequency step size is good, DNL is lacking between the fine and coarse banks over various frequency ranges.

The embodiments described supra have been focused around DCOs with the switched capacitor array. In another embodiment, another class of digital frequency converter (DFC) uses an injection locking technique to generate FM modulation. In one embodiment, a quadrature VCO includes two oscillators cross coupled such that once the system is injection locked, the pair generates quadrature phases. In this implementation, the FM modulation is generated by modulating the coupling strength between the two oscillator cores through an analog voltage. This continuous time and amplitude architecture can achieve linear modulation range of 60 MHz. Any mismatches in the two oscillators, however, also limit performance by introducing quadrature phase error. In another embodiment, a DFC employs injection locking for frequency generation at millimeter wave frequencies. This solution, however, is not practical for digitally intensive transmitters operating at much lower RF frequencies.

Self Injection Locked Digitally Controlled Oscillator

Figure 2:
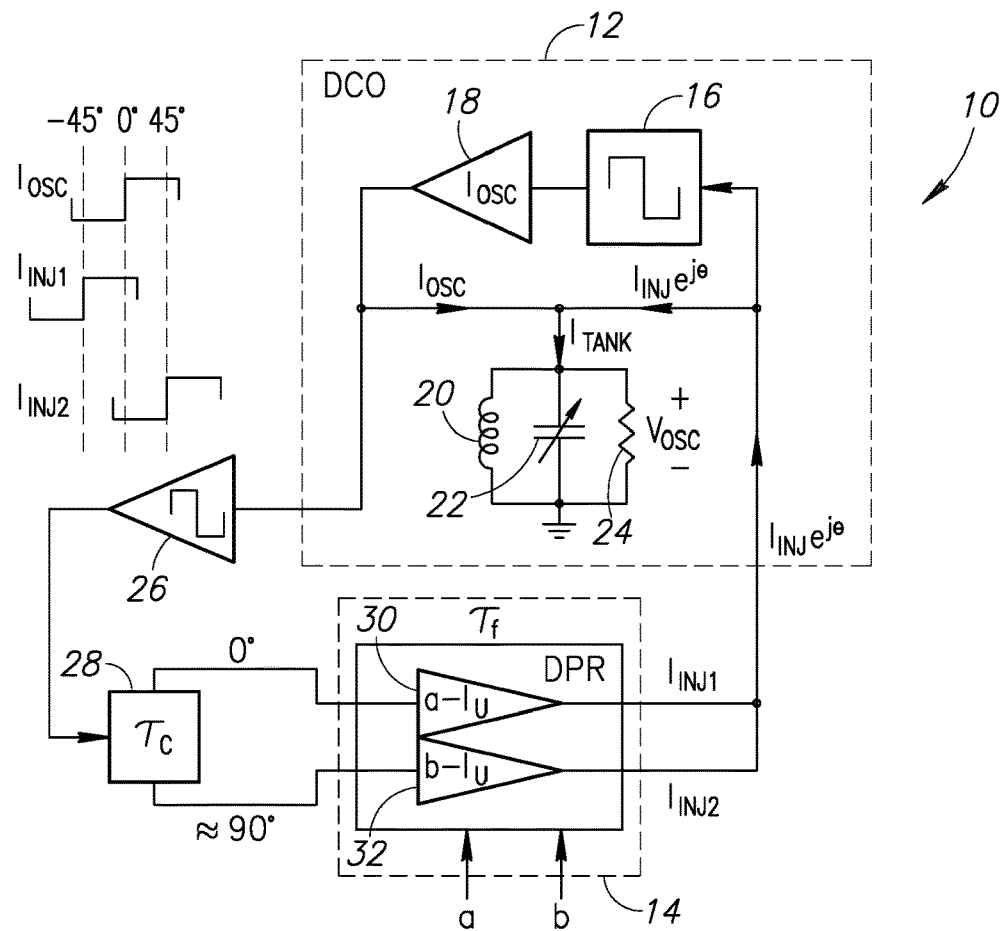
FIG. 2 is a high level schematic diagram illustrating a first example self injection locked oscillator of the present invention.

In another embodiment, injection locking of an oscillator is exploited using an auxiliary loop to perform the frequency modulation. A high level schematic diagram illustrating an example inverter ring oscillator of the present invention is shown in FIG. 2. The circuit, generally referenced 10, comprises a digitally controlled oscillator (DCO) 12, oscillator buffer 26 (e.g., signal squarer), phase generator 28 and digital phase rotator (DPR) 14. The DCO 12 also comprises the equivalent of a well-known transconductance amplifier $g_m$ stage, including squarer block 16 labeled with a "square wave" symbol (e.g., transistors M1 and M2 in FIG. 6A) and buffer component labeled "$I_{osc}$" (i.e. amplifier) 18 (e.g., transistor M3 in FIG. 6A). The squarer block functions to square up the sinusoidal signal input thereto. The amplifier is needed to maintain oscillation in the DCO.

The LC-tank of the digitally controlled oscillator (DCO), consisting of inductor 20, tunable capacitor 22 and equivalent parallel resistor 24, whose free-running frequency $\omega_o$ is set by the switched capacitor C 22, is injected with a delayed version of its own resonating waveform. The resulting frequency $\omega_{out}$ under such conditions is given by Adler's equation below:

$$\omega_{out}[n \cdot t_{sH}] = -\frac{\omega_0}{2 \cdot Q} \frac{I_{inj}}{I_{osc}} \cdot \sin(\theta[n \cdot t_{sH}]) + \omega_0 \quad (1)$$

where, Q is the LC-tank quality factor, $I_{osc}$ is the peak oscillator current, $I_{inj}$ is the peak injected current into the LC-tank, and $t_{sH}$ is the sampling time of the DFC (determined by $f_{sH}$). $\theta$ is the steady-state phase between $I_{osc}$ and $I_{inj}$ which implies that the system is injection locked. By manipulating the delay of the injected signal (and consequently $\theta$) the steady-state oscillator frequency $\omega_{out}$ varies according to Equation 1. The current $I_{TANK}$ into the tank is the vector sum of the oscillator current $I_{osc}$ and the injection current $I_{inj}$. Within a reasonable range of $\theta$ around 0°, $\omega_{out}$ increases linearly with $\theta$. The maximum variation of $\omega_{out}$ about $\omega_o$ for which the DCO is injection locked is limited by the injection locking range $\omega_L$ given by the following equation:

$$\omega_L = \frac{\omega_0}{2 \cdot Q} \frac{I_{inj}}{I_{osc}} \quad (2)$$

Figure 3:
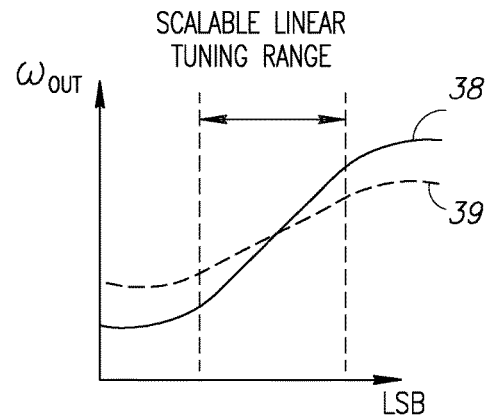
FIG. 3 is a diagram illustrating an example oscillator tuning range including linear portions.

The phase adjustment $\theta$ of the injected signal is performed in two steps. The first step is coarse and performed by the phase generator block represented by $\tau_c$ in the block diagram in FIG. 2. This circuitry also generates approximate quadrature signals that are used by the digital phase rotator (DPR) circuit, represented by $\tau_f$, to perform a fine phase adjustment. The DPR generates two orthogonal currents $I_{inj1}$ and $I_{inj2}$ that are injected directly into the oscillator core while the interpolation is performed by the LC-tank such that $I_{inj}$, the Euclidean vector sum of $I_{inj1}$ and $I_{inj2}$ is injected at a phase $\theta$ with respect to the DCO current $I_{osc}$. The phase delay due to $\tau_f$ varies from 0° to 90° about a mean phase which is determined by the blocks in the auxiliary feedback path including $\tau_c$ and is typically set to 0° (i.e. equivalent to 360° or multiples thereof). The signals that steer the injected currents are derived from the DCO, so the system is fully synchronous to $\omega_{out}$. The interpolated phase is a function of the ratio of currents $I_{inj1}$ and $I_{inj2}$, which is controlled by the digital codes a and b. The magnitude of the injected current $I_{inj}$ is controlled by the unit cell current $I_u$ and the digital codes a and b. The linear frequency modulation range 38, 39 shown in FIG. 3 is determined by the injection locking range, which is proportional to $I_r=I_{inj}/I_{osc}$. Both $I_{osc}$ and $I_{inj}$ are digitally controlled and therefore the DCO gain (Hz/LSB) and the linear FM tuning range can be scaled according to the desired application.

FM Modulation Using Injection Locking

Figure 4A:
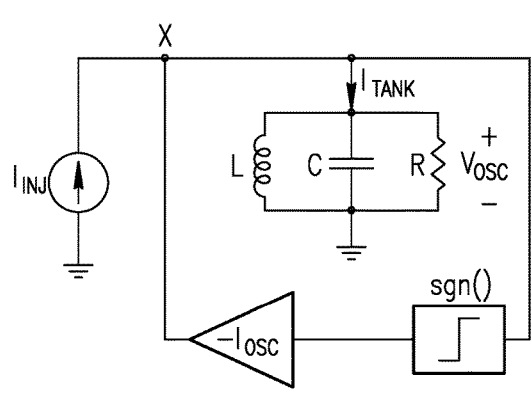
FIG. 4A is a schematic diagram illustrating an example numerical model of an injection locked oscillator.
Figure 4B:
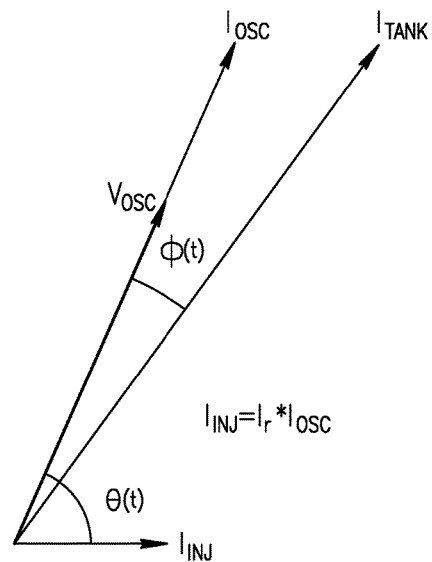
FIG. 4B is a diagram illustrating the phasor representation of the signals in the model of FIG. 4A.

A numerical model of a conventional injection locked oscillator will now be described. The various modes of an oscillator tank under the influence of an external signal can be analyzed by numerically modeling the circuit shown in FIG. 4A. This model is used to analyze trends before describing the oscillator in more detail. Of particular interest is the behavior of the oscillator phasor signals, shown in FIG. 4B, when the injected signal is within the injection-locking range. The model was developed in Simulink, a graphical programming environment for modeling available from The MathWorks Inc., Natick, Mass., USA. The following parameters were used: $I_{osc}$=1 mA, $f_o$=4.5 GHz, Q=10.6, L=0.85 nH, C=1.5 pF.

In that regime, the oscillator injection locks to the incident signal causing $\varphi(t)$ and $\theta(t)$ to become constant after a short settling time. In FIG. 4D, the phases $\varphi(t)$ and $\theta(t)$ are plotted as the injection frequency $f_{inj}$ is varied over and beyond the injection-locking range. The injection strength $I_r$ is set to 0.8. The regions when the oscillator is injection-locked or injection-pulled are annotated on the plot. Notice that when the oscillator is injection locked, the phases $\varphi(t)$ and $\theta(t)$ vary linearly as a function of $f_{inj}$. Both $\varphi(t)$ and $\theta(t)$ cross the origin around $\omega_0/2\pi$=4.5 GHz which is the resonance frequency of the LC tank. The oscillator is injection locked over a range of 400 MHz around 4.5 GHz.

Figure 4C:
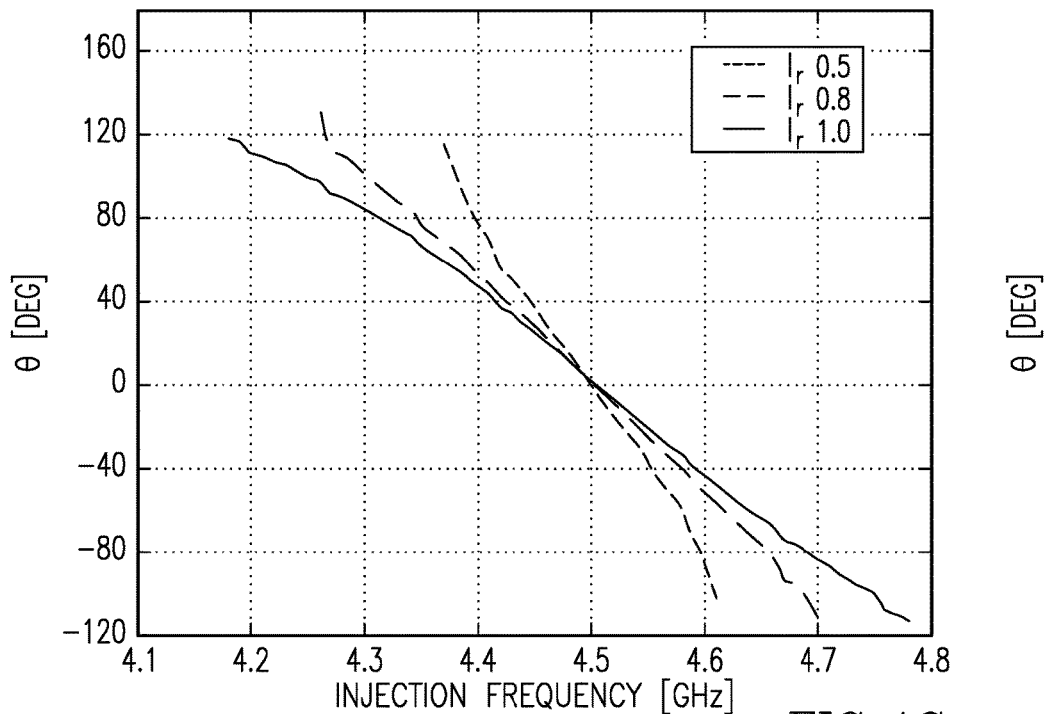
FIG. 4C is a graph illustrating θ versus injection frequency for various settings of $I_r$.
Figure 4D:
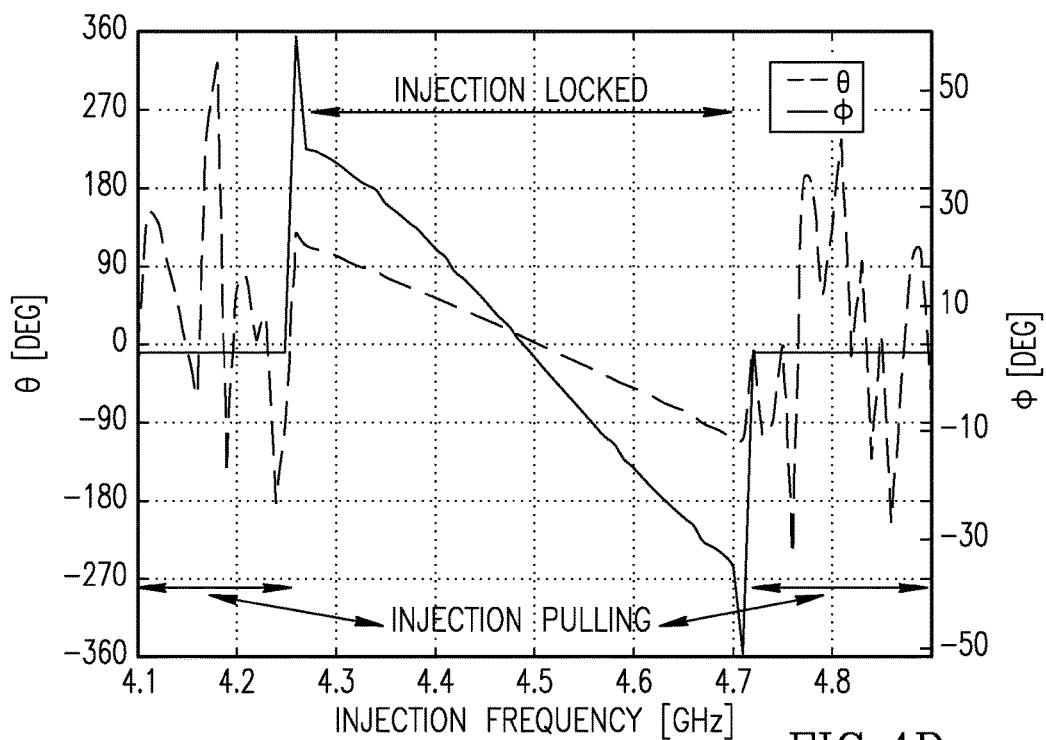
FIG. 4D is a graph illustrating φ(t) and θ(t) versus injection frequency.

As shown in FIG. 4C, $\theta$ varies linearly with $f_{inj}$. The range of $f_{inj}$ in FIG. 4C is the injection locking range, which is proportional to $I_r$. The slope of $\theta$ with respect to $f_{inj}$ decreases with increasing $I_r$. The injection lock range varies from 200 MHz, 400 MHz, and 600 MHz for $I_r$ values of 0.5, 0.8, and 1.0, respectively. Note that this plot is useful in understanding the operation of the invention. In FIG. 4C, $f_{inj}$ is the independent variable that determines $\theta$, while in the oscillator of the present invention, $\theta$ is the independent variable or forcing condition that determines the steady-state frequency of the oscillator. The values for $I_r$ and Q are chosen arbitrarily to show the extent of FM bandwidth theoretically possible with an injection locked oscillator. The trends observed from this model are the same for the targeted value of $I_r$ of 0.15 which results in a narrower linear FM range.

Numerical Model of a Self Injection Locked Oscillator

A numerical model of the self injection locked oscillator of the present invention will now be described. After briefly describing injection locking theory, the self injection locked oscillator of the present invention is described in more detail.

Figure 5A:
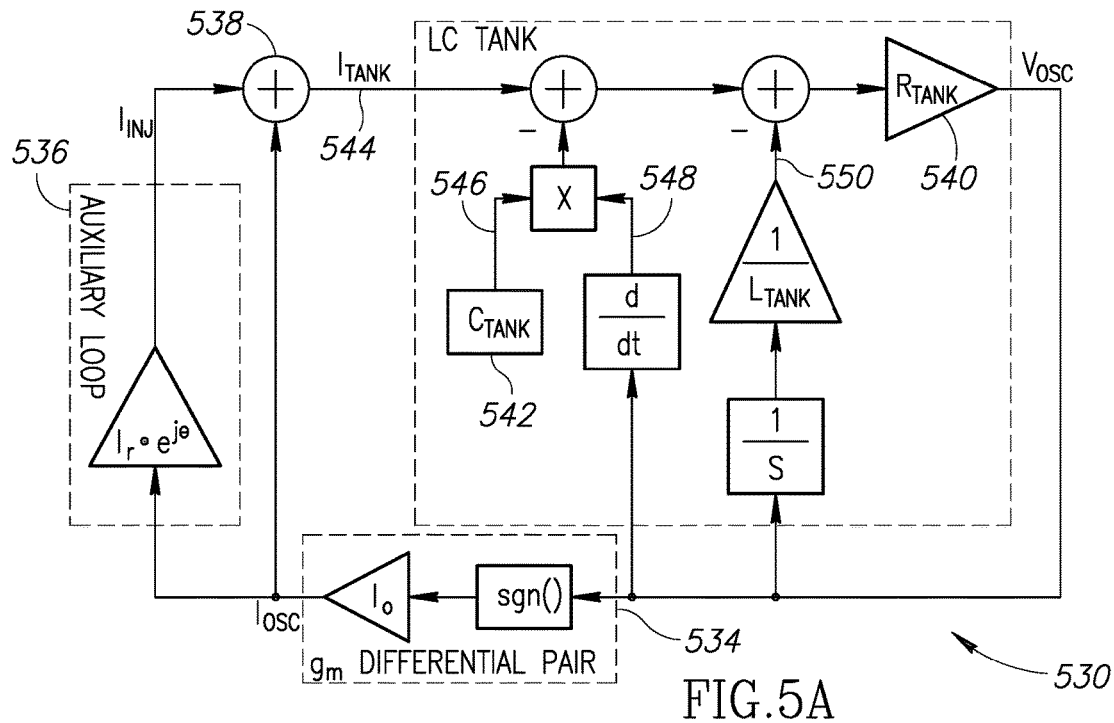
FIG. 5A is a block diagram illustrating an example numerical model of an injection locked oscillator with an auxiliary loop.

FIG. 5A is a Simulink model of an injection locked oscillator, generally referenced 530, comprising an LC tank 532, $g_m$ differential pair 534 and auxiliary loop 536. Four currents are summed at the input of block $R_{tank}$ 540. These currents are from the capacitor 546, inductor 550, commutating transistor pair 548 and injecting circuit 544. This model exploits the injection locking phenomenon as a way to generate FM. Instead of using an independent signal source, the injected signal is directed from the oscillator output and phase delayed by a certain time interval. This essentially creates an auxiliary feedback path in the oscillator, the delay of which is varied in order to change the oscillating frequency. $I_r$ in FIG. 5A scales the peak injection current $I_{inj}$ with respect to $I_{osc}$ and can also be used to vary the linear FM range or the injection locking range.

Simulation results from the numerical model will now be described. Given that the oscillator is injection locked, the final oscillating frequency is given by Equation 1. The argument $\theta[k]$ in this equation is modulated in the model shown in FIG. 5A. A transient simulation with 500 k samples was run in small increments over a range of $\theta[k]$ that exceeds ±100°. In this simulation, $I_{osc}$ is 1 mA, $Q_{tank}$ is 10.6, $L_{tank}$ is 0.9 nH, and $C_{tank}$ is 1.4 pF.

Figure 5B:
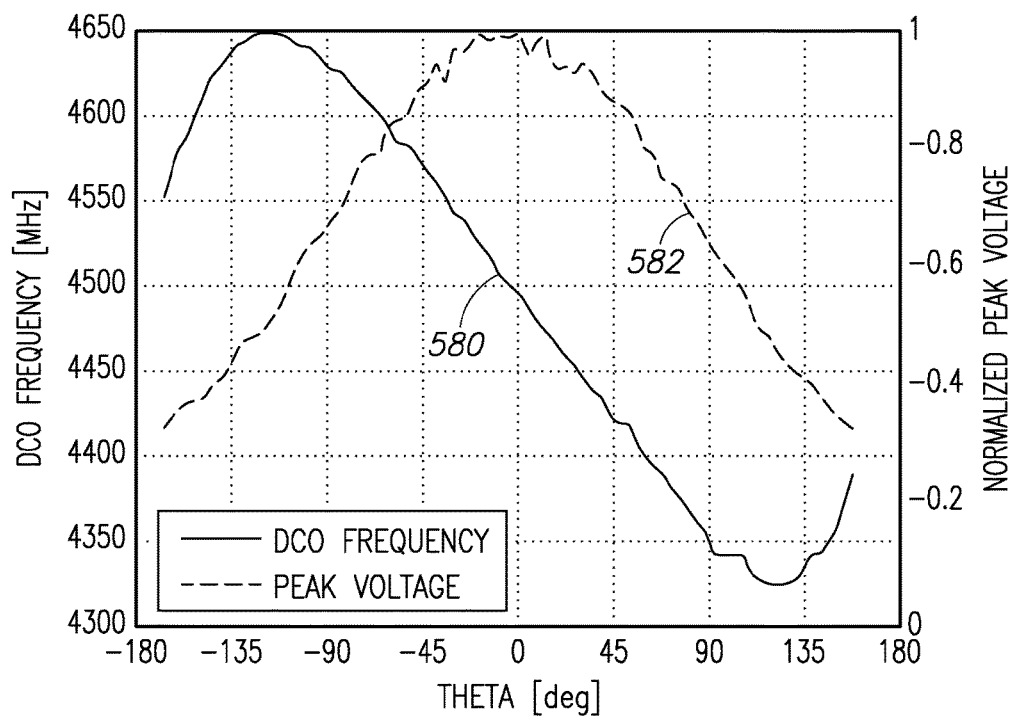
FIG. 5B is a graph illustrating simulation results of injected signal phase θ and resulting DCO frequency.

FIG. 5B shows the simulation results with $I_r$=0.5. Several observations are noted and discussed below. First, the oscillating peak voltage $V_{osc,pk}$ (normalized peak voltage)

decreases as the oscillator is steered away from the free resonant frequency $\omega_0$. This loss of amplitude results in a degradation of the DCO phase noise. The variation in $V_{osc,pk}$ increases with the injection strength. The auxiliary feedback path that is phase delayed by θ in FIG. 5A acts as positive feedback and hence augments or amplifies the oscillation signal only when θ is ~0°. At other values of θ, the feedback impedes the main oscillation. When θ approaches 180°, this feedback becomes negative and, if strong enough, can stop the oscillation altogether. This is especially true for cases when $I_r$ is close to 1. This limitation, however, is not a cause for concern here for two main reasons. First, the $I_r$ targeted here is around 0.15. Also, the target range for θ is ±45°, which, according to FIG. 5B, is where the oscillator tuning range is linear and the variation in $V_{osc,pk}$ is small. The output of the DCO is sourced from the proceeding buffer stage which acts like a hard limiter and therefore any parasitic amplitude modulation (AM) due to the peak voltage trace (dashed line 582) in FIG. 5B will be removed.

Oscillator Core Embodiments

Several oscillator cores may be used with the present invention. Three examples of possible oscillator cores are provided and described below. They include a DCO with filtering of the second harmonic, DCO without such filtering and a voltage controlled oscillator (VCO).

Figure 6A:
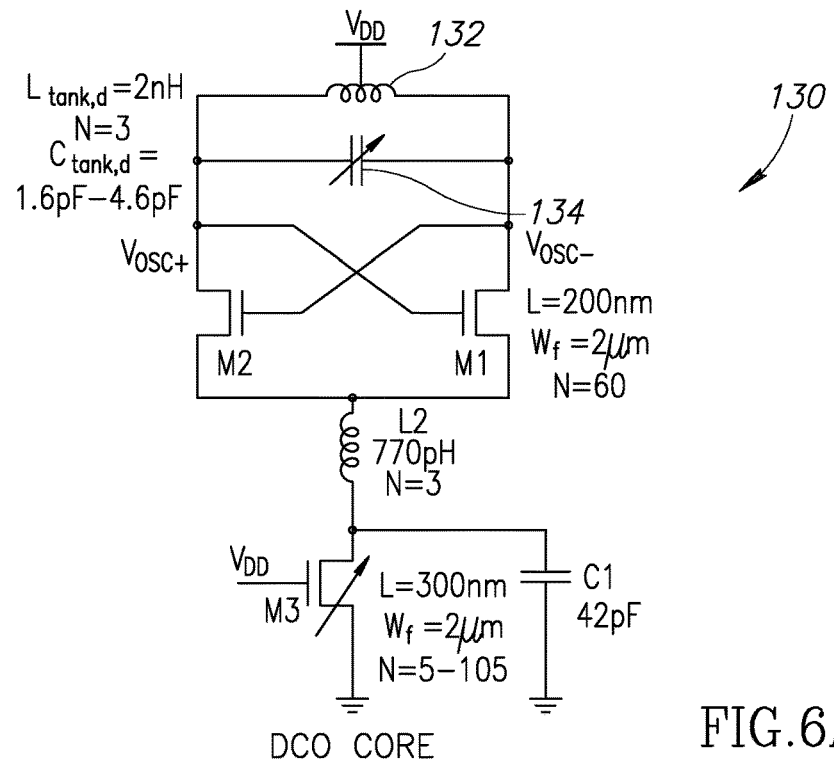
FIG. 6A is a schematic diagram illustrating an example DCO core with second-harmonic filtering of the present invention.

A high-level circuit diagram of an example embodiment of the digitally controlled oscillator (DCO) with filtering, generally referenced 130, is shown in FIG. 6A. The DCO core supply is 1.1V. The differential tank inductance 132 is 2 nH while the differential tank capacitance 134 is digitally controlled between 1.6 pF and 4.6 pF. The M3 NMOS transistor operates in a triode region with channel resistance digitally controllable between 5 to 105Ω. The fact that M3 operates in triode necessitates the placement of L2. Capacitor C1 is maximized in order to filter any noise from the current sink that can upconvert due to the switching action of M1 and M2 and degrade oscillator phase noise. The LC tank comprises the inductor 132 and binary weighted MOM capacitors 134 controlled via a digital input (e.g., 8-bit).

Figure 6B:
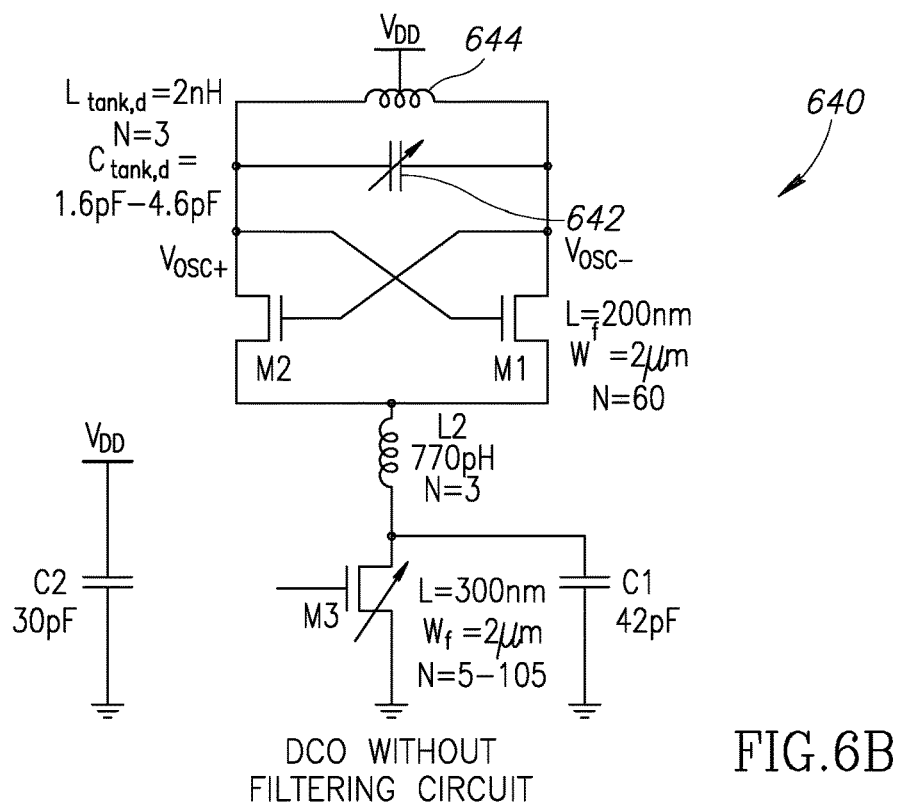
FIG. 6B is a schematic diagram illustrating an example DCO core without the second-harmonic filtering of the present invention.

A schematic diagram illustrating an example DCO core without filtering of the present invention is shown in FIG. 6B. In this circuit, the DCO 640 operates without the filtering circuit of FIG. 6A, also known as $2^{nd}$ harmonic trap and M3 operates in saturation. The core supply of the DCO is 1.1V. The differential tank inductance 644 is 2 nH while the differential tank capacitance 642 is digitally controlled between 1.6 pF and 4.6 pF. The M3 NMOS transistor operates in a triode region with channel resistance digitally controllable between 5 to 105Ω. The LC tank comprises the inductor 644 and binary weighted MOM capacitors 642 controlled via a digital input (e.g., 8-bit). Note that the filtering circuit including L2 of FIG. 6A is not present in the circuit 540 of FIG. 6B.

Figure 6C:
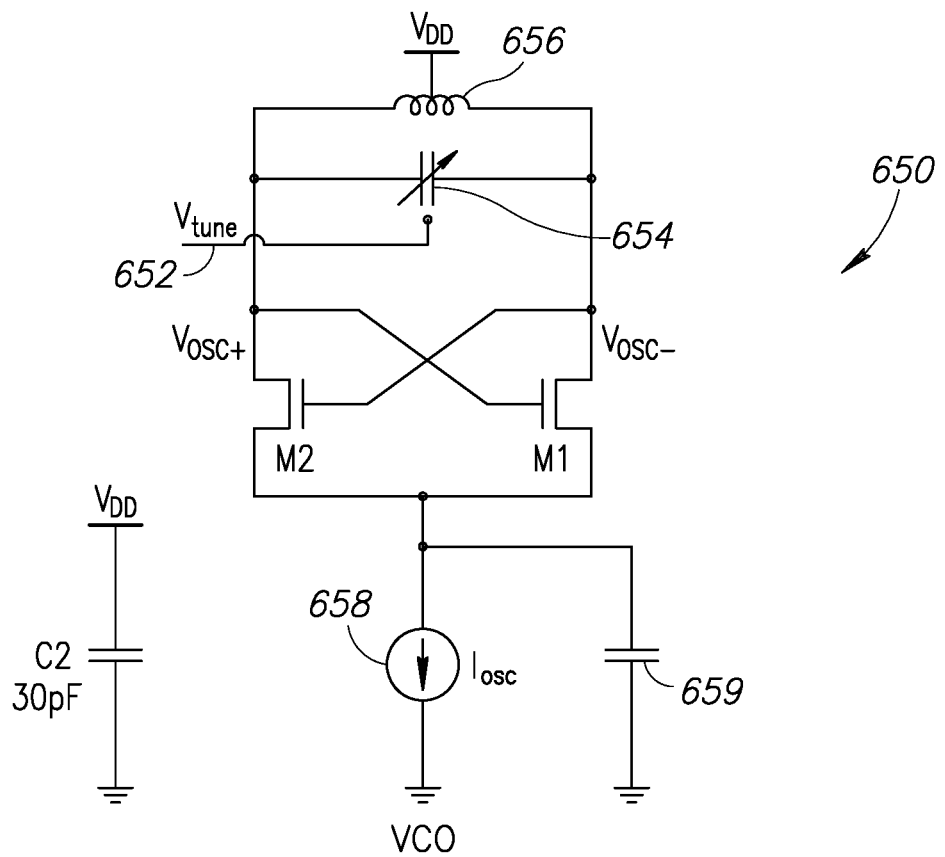
FIG. 6C is a schematic diagram illustrating an example VCO core of the present invention.

A high-level circuit diagram of an example embodiment of a voltage controlled oscillator (VCO), generally referenced 650, is shown in FIG. 6C. This circuit operates as a voltage controlled oscillator (VCO) rather than a DCO. The tail current source 568 provides the operating bias for the cross coupled transistors M1 and M2 while the analog tuning voltage $V_{tune}$ 652 controls the LC tank resonance frequency. The VCO core supply is 1.1V. The differential tank inductance 656 is 2 nH while the differential tank capacitance 654 is voltage controlled via the $V_{tune}$ signal.

Phase Generator

Figure 7A:
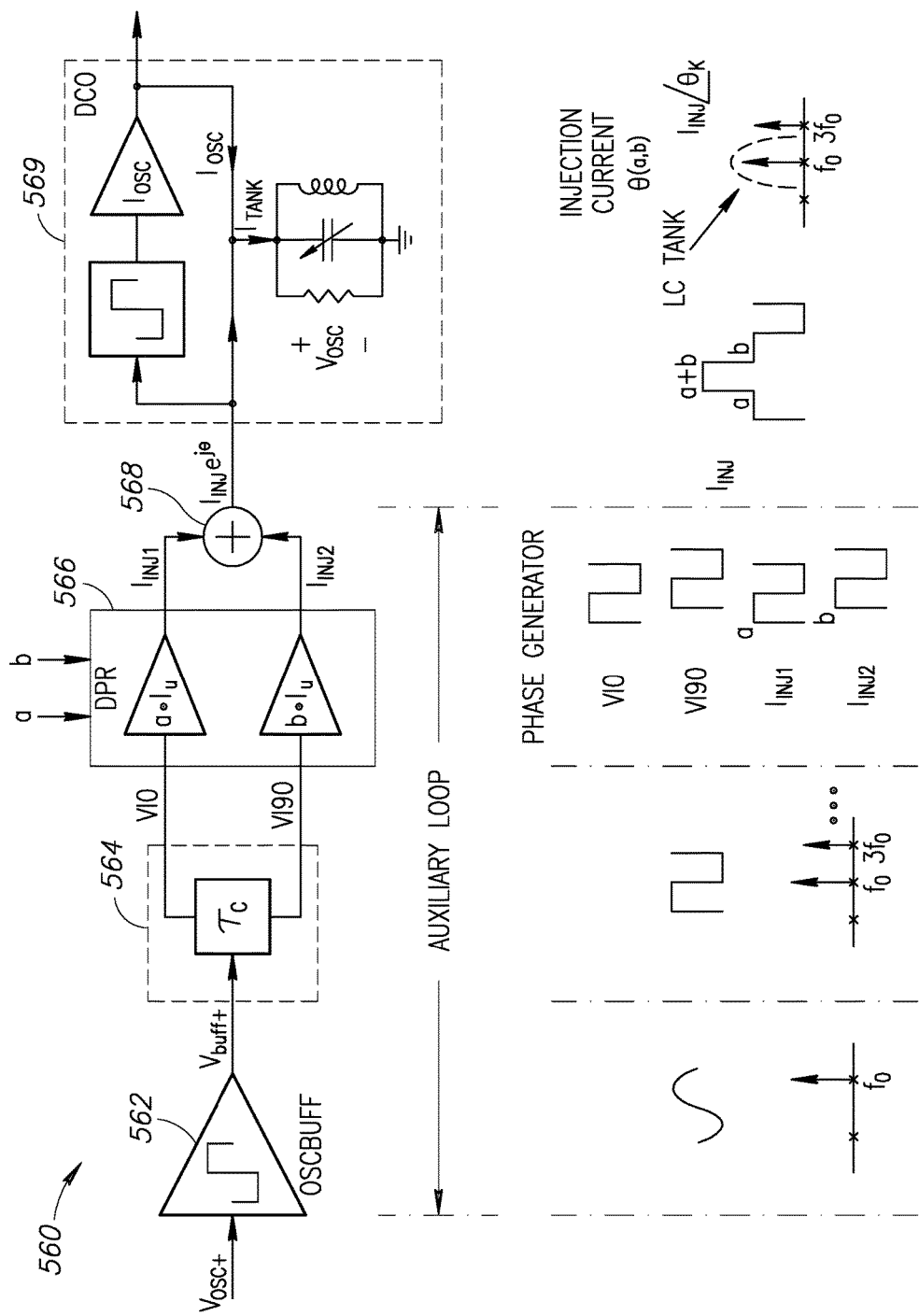
FIG. 7A is a block diagram illustrating a first example auxiliary loop time and frequency domain representation of various signals thereof.

A block diagram illustrating a first example phase injection mechanism and related waveforms of the $I_{inj1}$ and $I_{inj2}$ injection currents is shown in FIG. 7A. The auxiliary loop, generally referenced 560, comprises the phase generator 564 and the digital phase rotator (DPR) 566. Proper design of the auxiliary loop is essential for the frequency tuning of the DCO. The principle function of this auxiliary path is to generate a phase delayed version of the oscillator output such that $I_{inj}$ forms an angle θ with $I_{osc}$ as shown in FIGS. 5A and 5B. The angle θ is generated by the delay stages in the phase generator block and the DPR and is described by the following equations:

$$\theta(n \cdot t_{sH}) = \theta_c(\tau_c) + \theta_f(n \cdot t_{sH}) \tag{3}$$

$$\theta(n \cdot t_{sH}) = \theta_c(\tau_c) + \tan^{-1}\left(\frac{b(n \cdot t_{sH})}{a(n \cdot t_{sH})}\right) \tag{4}$$

where coarse phase $\theta_c$ is generated by the delay stage $\tau_c$ in the phase generator block and the fine phase $\theta_f$ is adjusted by the DPR through control words a and b as described in more detail infra. As shown in FIG. 7A, the oscillator voltage $V_{osc}$ is converted to a square wave clock by the oscillator buffer 562. The clock is controllably delayed by the coarse delay circuit $\tau_c$, which produces two output clocks VI0 and VI90 with approximately quadrature phase relationship.

These two clocks are then fed to the DPR 566, which creates synchronous current pulses $I_{inj1}$ and $I_{inj2}$ with gains controlled by the digital steering signals a and b. The two currents are summed (via summer 568) and injected as $I_{inj}$ with phase θ, back into the oscillator tank. The pedestal in $I_{inj}=I_{inj1}+I_{inj2}$ is due to the phase shift between the VI0 and VI90 signals. The level of the pedestal is determined by the number of current cells turned on in the DPR array via a and b. The current injected into the DCO is band-pass filtered by the LC tank. Therefore, higher harmonics injected into the DCO do not severely impact the circuit's operation. The LC tank also serves as the interpolator that averages between the VI0 and VI90 phases based on the weights determined by controls a and b.

Assume that the LC tank of the oscillator is tuned to a frequency of 4.2 GHz. According to FIG. 7A, the auxiliary path delay comprises the oscillator buffer, phase generator, DPR and interconnects. The delay due to interconnecting wires can be ignored since the entire circuitry is located within a small area. At a frequency of 4.2 GHz, the simulated oscillator buffer delay is 17.3 ps (26.2°). The delay of the phase generator is 72 ps (108.8°). A 180° phase arises due to inversion inside the DPR current steering cell. At a mid code setting of the DPR DAC, the current controls a and b are equal and therefore $\theta_f$ from Equation 4 is 45°. This brings the total phase delay in the auxiliary path to 360°. Consequently, θ is zero and $I_{inj}$ is in phase with $I_{osc}$ and according to Equation 1 the oscillator frequency ($\omega_{out}$) is $\omega_o$. In order to vary $\omega_{out}$ around $\omega_o$, $\theta_f$ is tuned between 0° to 90° by adjusting control words a and b in the DPR while the maximum possible variation of $\omega_{out}$ is defined by $\omega_L$ in Equation 2. Under such a condition, $\tau_c$ is considered to be properly set and it also ensures that the low-to-high transitions on VI0 and VI90 occur around the 0° phase of oscillator output voltage $V_{osc+}$ as shown in FIG. 8B. The upper and lower limit of the interpolated phase ($\theta_f$) is determined by the VI0 and VI90 signals and with the proper setting of $\tau_c$, the injected phase lands in the linear θ to $\omega_{out}$ conversion region shown in FIG. 5B. Also note that the discussion so far has been in the context of narrowband FM (NBFM) modulation because θ is a linear function of $\theta_f$ only under such condition.

Figure 7B:
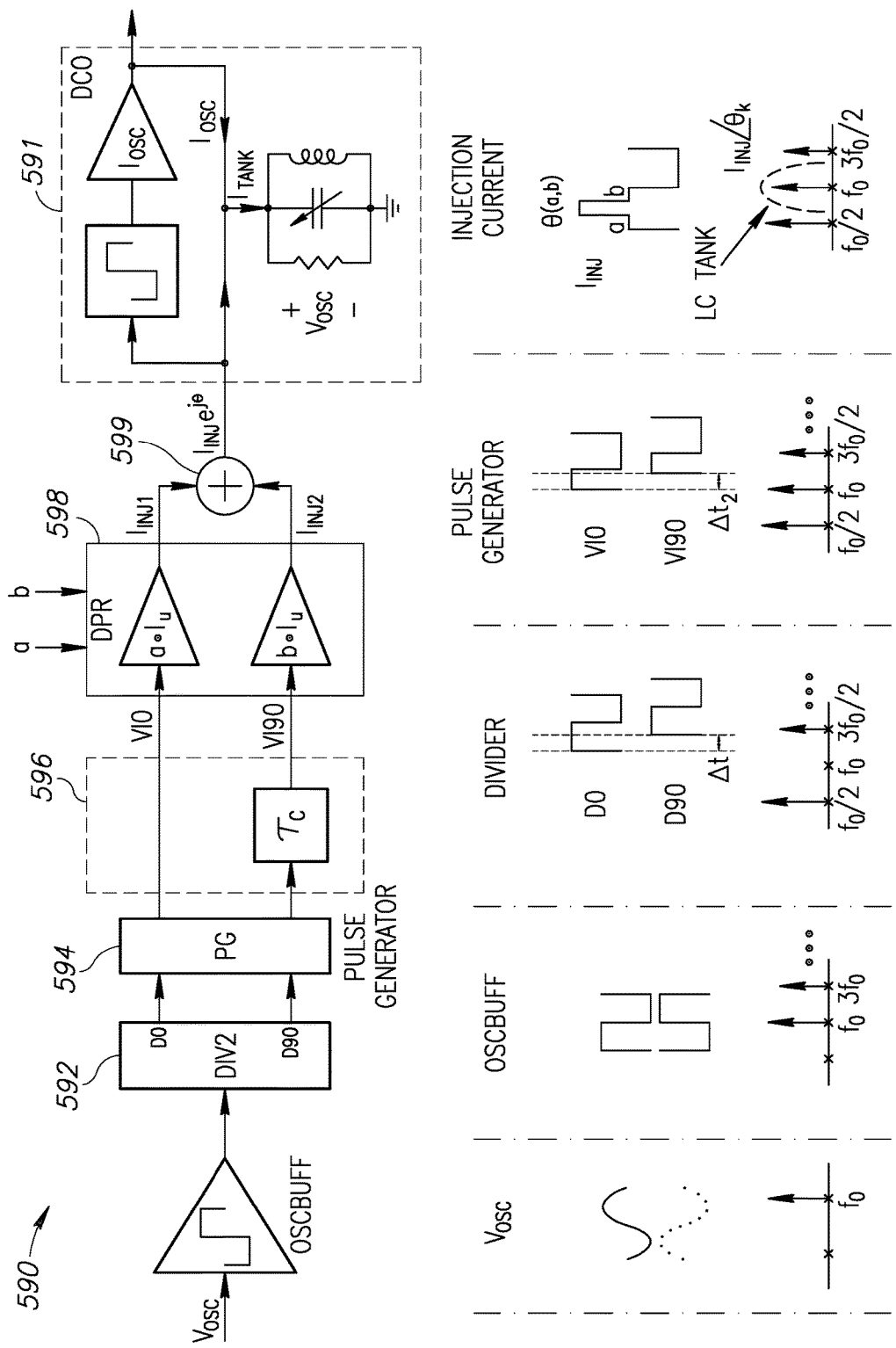
FIG. 7B is a block diagram illustrating a second example auxiliary loop time and frequency domain representation of various signals thereof.

A block diagram illustrating a second example phase injection mechanism and related waveforms of the injection currents is shown in FIG. 7B. This architecture, generally referenced 590, utilizes a divider circuit 592 in the feedback loop. The output of the divider is at half the frequency of the DCO 591 and is input to the pulse generator block 594 which essentially adjusts the duty cycle of the input signal. The reduction in duty cycle depends on the division ratio. For a division ratio of two, the duty cycle must be set around 25% to maximize the $2^{nd}$ harmonic component which is equal to the oscillation frequency. For a division ratio of four, the duty cycle must be set around 12.5% to maximize the $4^{th}$ harmonic component which is equal to the oscillation frequency. Also note that the 90° and 270° phases from the divider are not useful at all. This is because a 90° phase shift at the divider output will translate into 180° phase shift for the $2^{nd}$ harmonic component which is at $f_o$. Therefore the VI90 and VI270 signals must be derived from the D0 and D180 outputs of the divider 592 using the same technique as shown in FIG. 7A. The DPR current waveforms will have components at the fundamental and harmonics. In the case shown in FIG. 7B, the $2^{nd}$ harmonic component will be the dominant signal after the LC tank filtering.

Figure 7C:
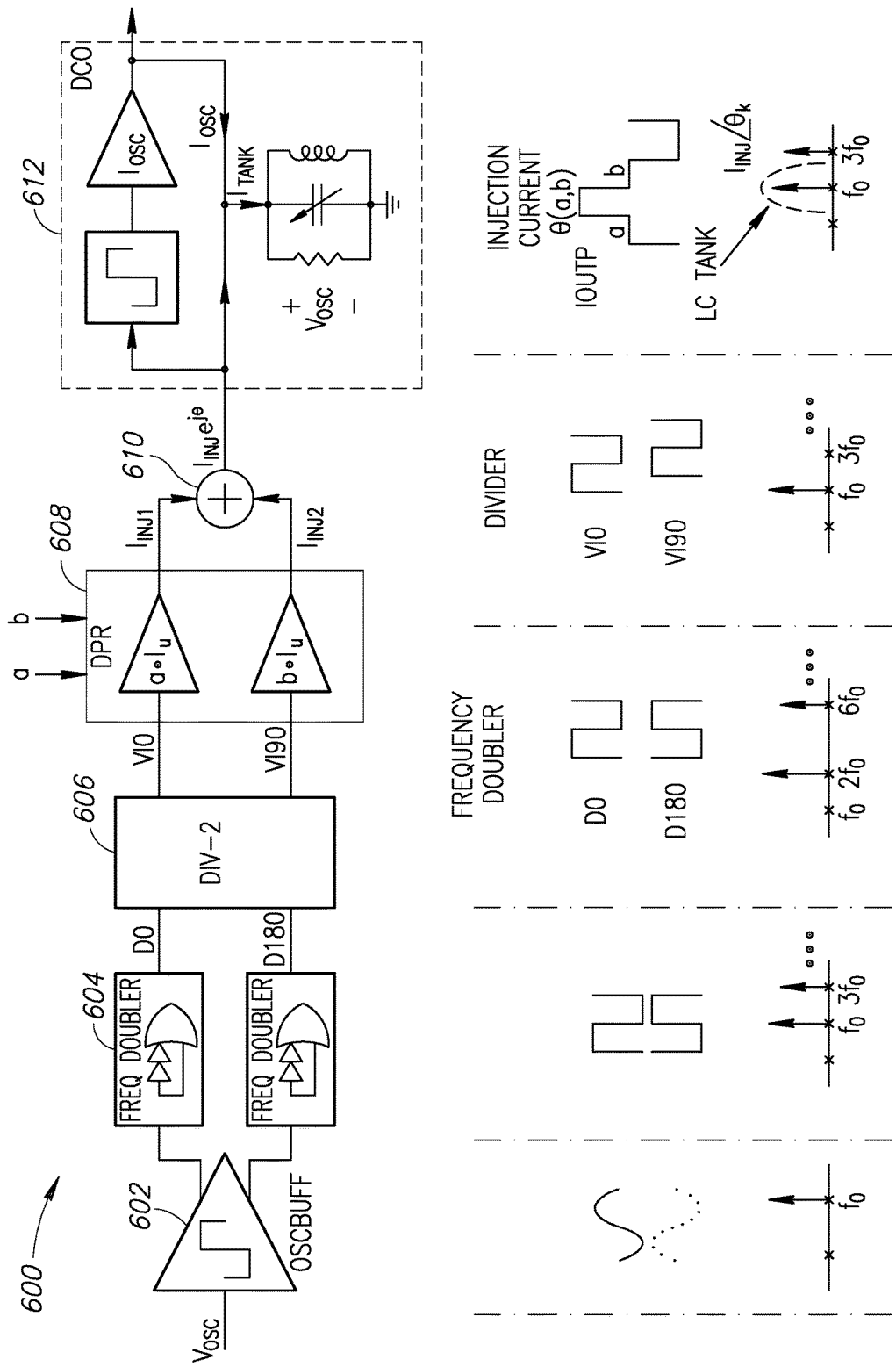
FIG. 7C is a block diagram illustrating a third example auxiliary loop time and frequency domain representation of various signals thereof.

A block diagram illustrating a third example phase injection mechanism and related waveforms of the injection currents is shown in FIG. 7C. This architecture, generally referenced 600, utilizes a frequency doubler 604 in the feedback loop followed by a frequency divider 606. In this manner, the VI0 and VI90 signals are at frequency $f_o$ of the DCO 612. The signals D0 and D180 output of the frequency doubler are at twice the oscillator frequency due to the XOR operation between the phase delayed versions of the DCO signal. The duty cycle of D0 and D180 may not be 50%. The divider, however, compensates for this issue. The quadrature phases at the DCO frequency are generated without using any DCD blocks. This is a key advantage of this architecture over the one shown in FIG. 7A.

Figure 8A:
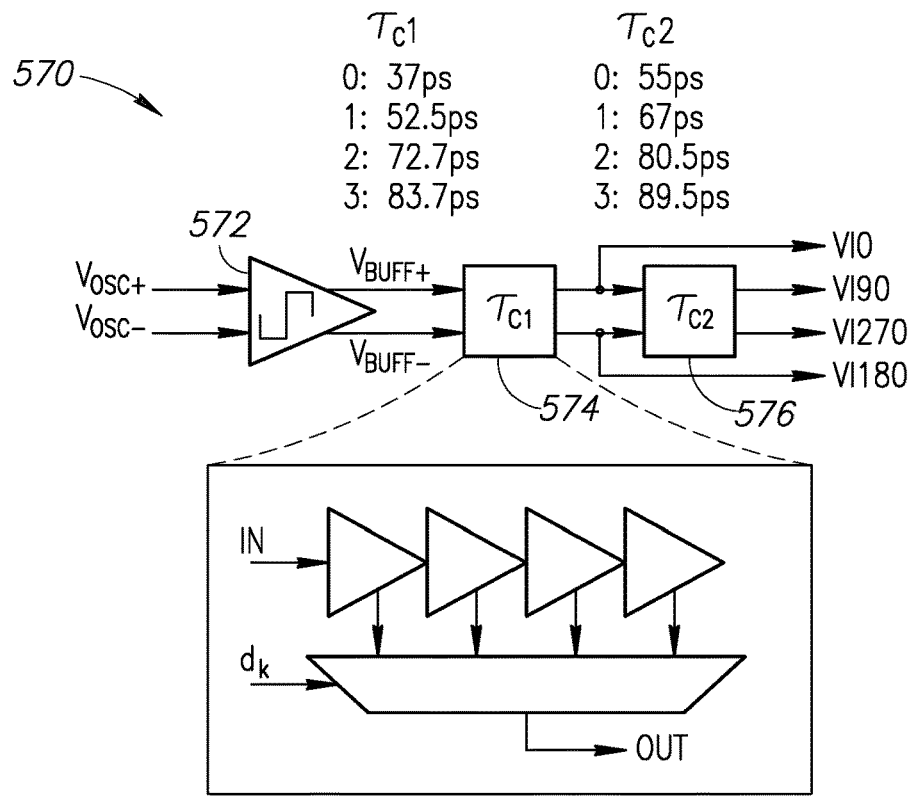
FIG. 8A is a block diagram illustrating an example phase generator of the present invention.
Figure 8B:
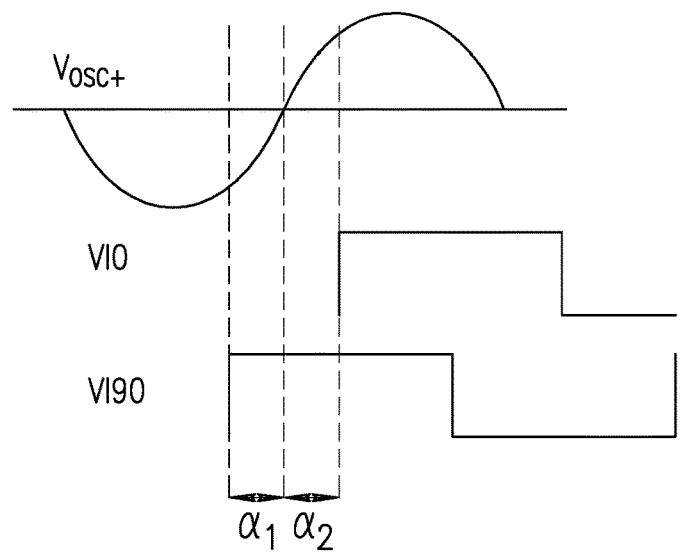
FIG. 8B is a diagram illustrating the phase relationships between various signals of the circuit of FIG. 8A.

Details of the coarse delay line, generally referenced 570, are shown in FIG. 8A. The delay line comprises oscillator buffer 572 and two cascaded digitally controlled coarse delay lines $\tau_{c1}$ 574 and $\tau_{c2}$ 576. The phase delay in the auxiliary feedback loop has to be 360° across the DCO LC tank tuning range. If the LC tank is tuned for lower frequencies, additional delay stages within $\tau_{c1}$ are engaged and vice versa. $\tau_{c2}$ is designed to generate the 90° phase shift between VI0 and VI90 signals. The phase delay will vary over the oscillator's frequency range, process, supply and temperature. Therefore $\tau_{c1}$ is preferably calibrated. A well regulated circuit supply will ensure limited voltage variation over time. Simulations show a 2 ps delay variation in each stage over temperature (−40° C. to 85° C.) which implies according to Equation 2 that θ will have an offset when the DPR DACs are at mid code. Consequently, the linear FM range may be reduced. The behavior of inverter delay with respect to temperature, however, is linear and well characterized. Therefore such offsets can be removed by monitoring the IC temperature and adjusting the number of delay stages $\tau_{c1}$ based on an empirical model. Table 1 below presents the simulated phase difference between VI0/VI90 and $V_{osc+}$ signals.

TABLE 1

Simulated Phase Difference Between VI0/VI90 and $V_{OSC+}$ Signals

| $\tau_{c1}$ Delays | $\alpha_1$ [deg] | $\alpha_2$ [deg] | $\alpha_1 + \alpha_2$ [deg] |
|---|---|---|---|
| 1 | 194.6 | 100.5 | 94.1 |
| 2 | 129.7 | 35.5 | 94.1 |
| 3 | 65.8 | 28.4 | 94.2 |
| 4 | 2.0 | 92.1 | 94.2 |

Note that for proper operation of the DPR, the phase difference between VI0 and VI90 should be approximately 90°. The aforementioned conditions are satisfied according to the simulation results in Table 1 when three delay stages at 4 GHz are engaged in the $\tau_{c1}$ block.

Digital Phase Rotator

Figure 9A:
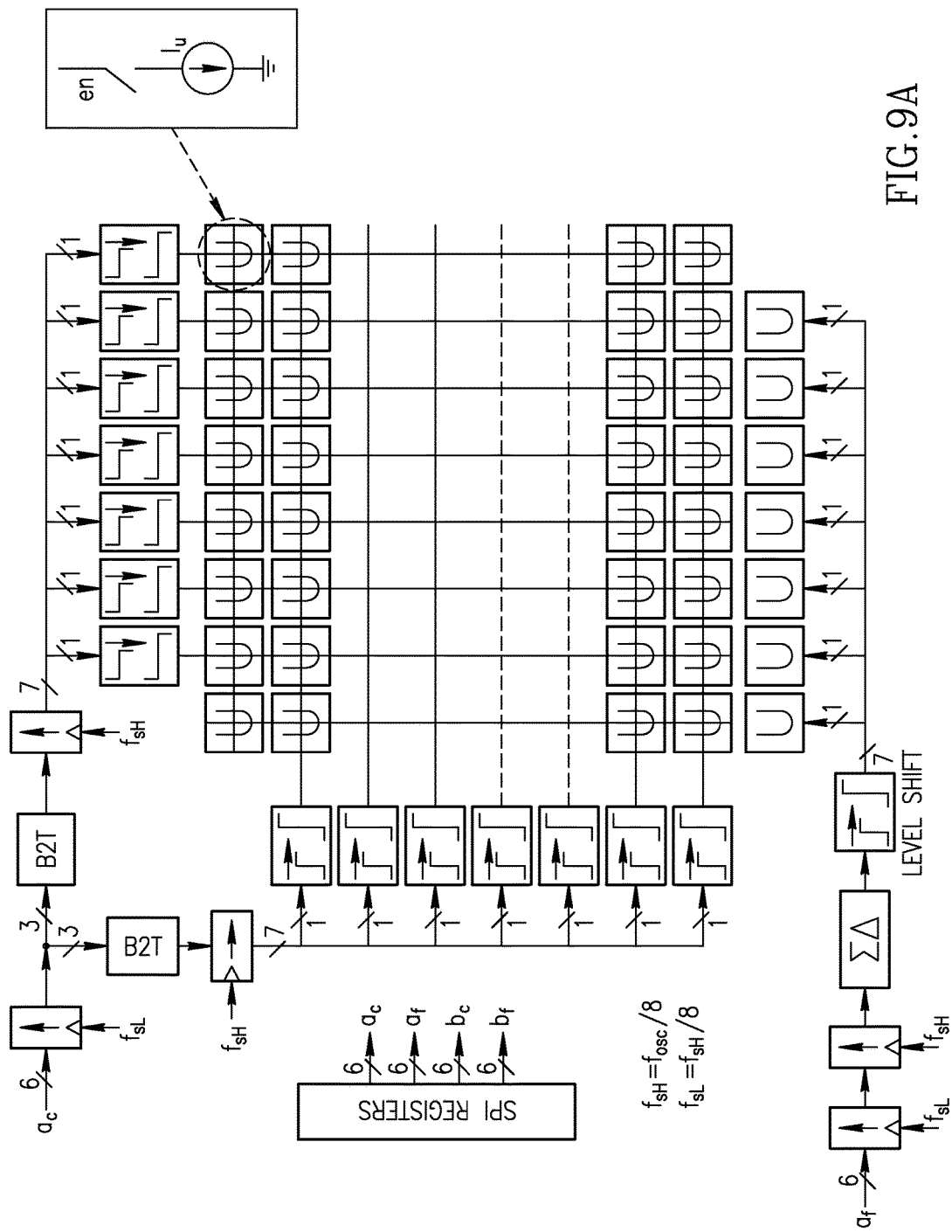

A simplified high-level block diagram of the DPR block is shown in FIG. 9A. The digital phase rotator (DPR) functions to interpolate between the signals generated by the phase generator block discussed supra. The DPR circuit is essentially two interleaved current steering DACs with mutually exclusive selection of current sources. Interleaving the current cells minimizes the mismatch between the two DACs but, however, makes the routing more complex. In one example embodiment, the DPR array comprises 64 unit cells controlled by coarse control words $a_c$ and $b_c$ and seven unit cells controlled by fractional control words $a_f$ and $b_f$ through a MASH ΣΔ stage. Each unit cell contains two current steering cells, one for each interpolating vector VI0 and VI90 and their respective differential phases. The output currents are summed at nodes $V_{osc+}$ and $V_{osc-}$ and injected into the LC tank of the DCO.

The current control word a is split into 6-bit integer word $a_c$ and 6-bit fractional word $a_f$. The control word $a_c$ is further split in the DPR array into three bits for row selection and three bits for column selection. These portions are thermometer encoded and passed through a level shifter before being passed into the unit cell U of the DPR array. The fractional word $a_f$ is applied to a MASH ΣΔ converter. The 7-bit output of the ΣΔ converter is level shifted and then applied to the DPR unit cells. Current control word b is configured in the same manner. For the NBFM case, if the DCO frequency resolution is high enough to meet the spectral mask requirements, the ΣΔ converter may not be needed. Therefore, any impairments originating from ΣΔ processing such as mismatch between coarse and fine unit cells etc. may not be relevant.

The digital portion of DPR block samples the current control settings a and b from the SPI registers. The SPI registers are latched by an external clock, which is asynchronous to any clocks derived from the DCO. Therefore, in the first stage, the a and b integer and fractional words are sampled by $f_{sL}$ which is derived from the DCO clock. The integer control bits are then split and thermometer encoded. In the next stage, the integer and fractional words are up-sampled by $f_{sH}$. This clock also drives the MASH sigma-delta converters and the DPR array.

DPR Unit Cell

Figure 9B:
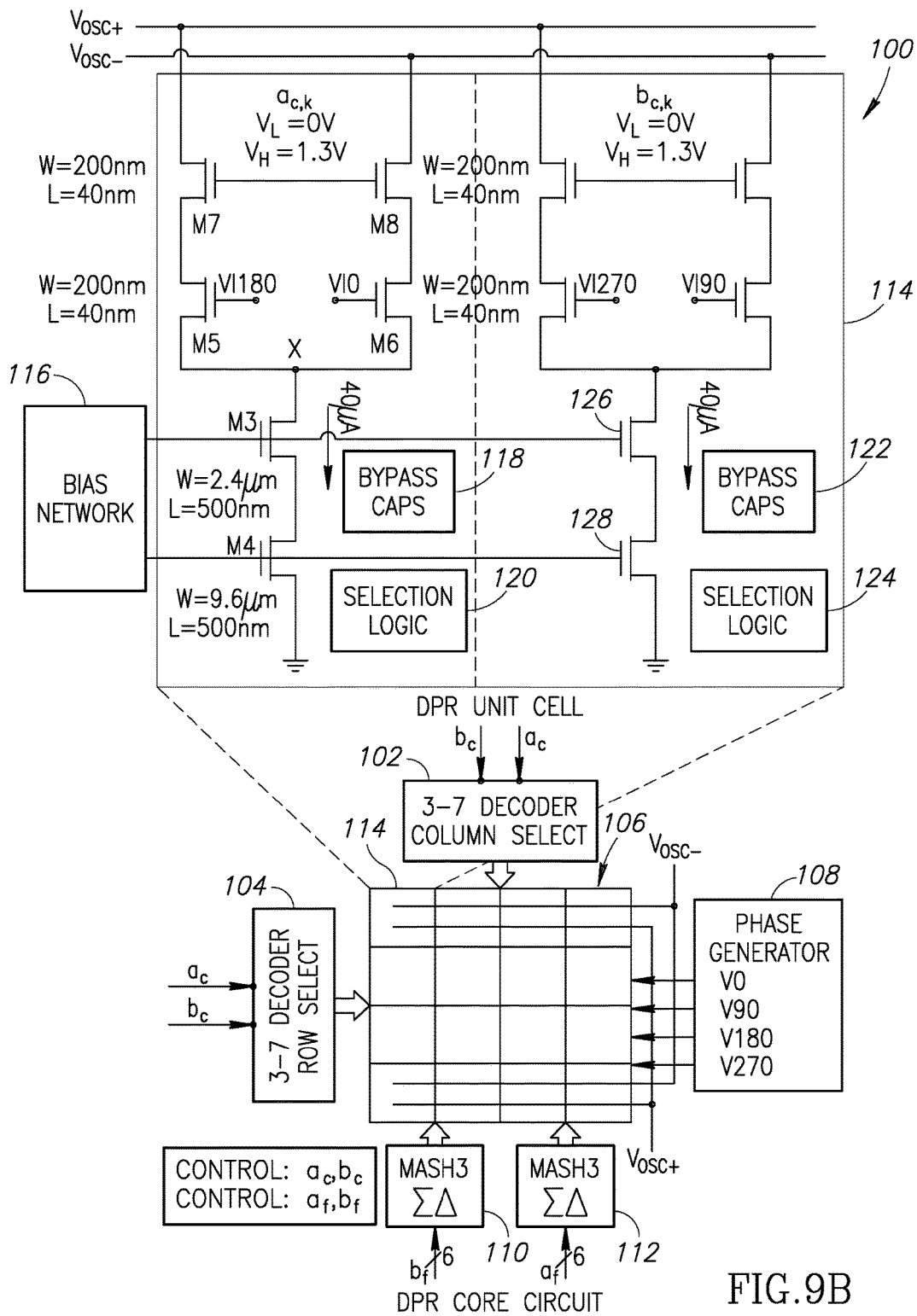
FIG. 9B is a schematic diagram illustrating the DPR core circuit and related unit cell structure.

The DPR unit current cell, illustrated in FIG. 9B, comprises a cascode current source (M3, M4), differential pair (M5, M6), enable switch (M7, M8), selection logic 120, 124 and bypass capacitors 118, 122. A current reference circuit 116 supplies bias to the cascode current mirror in each cell. The typical current in each unit cell is 30 µA. The cascode current source topology increases the output impedance looking into node 'X.' This is important because the remaining transistors in that cell, M5, M6, M7 and M8, operate in a triode region when turned on and offer very little resistance to ground. The differential output node of each current cell is connected to the DCO. This will result in some loading of the DCO output.

Calibration

Figure 10A:
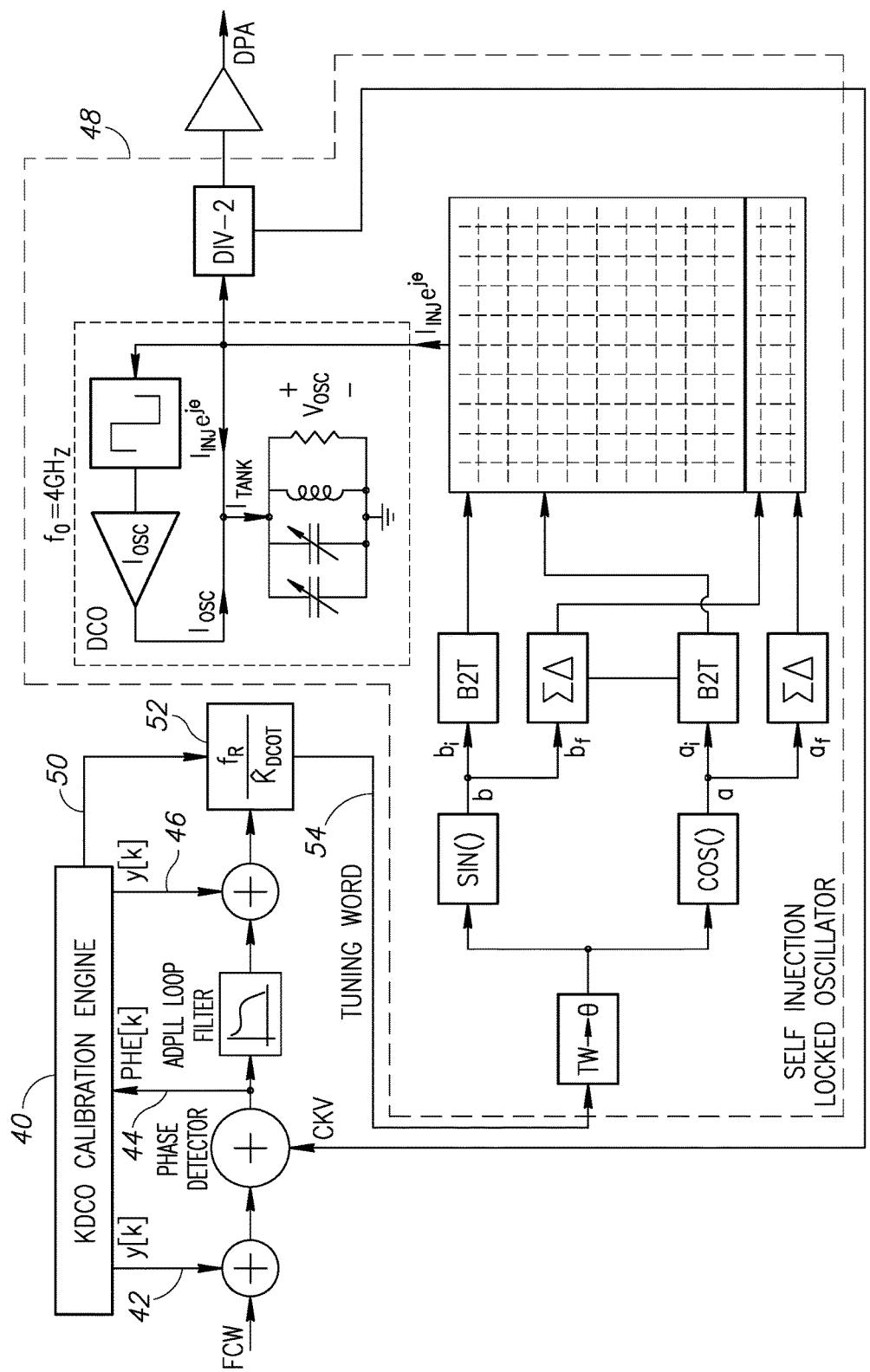
FIG. 10A is a block diagram illustrating an example $K_{DCOT}$ calibration engine for monitoring the PHE signal to optimize $\tau_{c1}$.
Figure 10B:
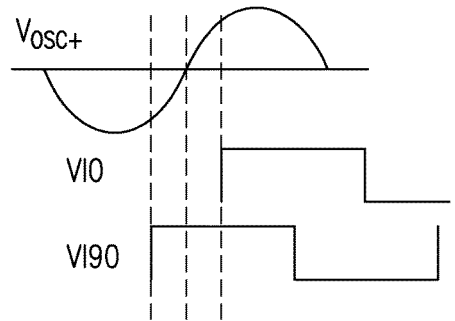
FIG. 10B is a diagram illustrating calibration of the $\tau_{c1}$ delay line for proper timing between VI0/90 and $V_{osc+}$.

As discussed supra, the quadrature phases for the DPR block generated by the phase generator are preferably aligned with the oscillator voltage waveform $V_{osc}$, as shown in FIG. 10B. A misalignment of DPR signal phase with DCO signal phase will result in an injected signal whose phase is not in the linear frequency tuning range as shown in FIG. 3. The proper alignment of DPR signal phases with the DCO can be achieved by setting the $\tau_{c1}$ coarse delay line.

The mechanism of calibrating the $\tau_{c1}$ delay line is illustrated in FIG. 10A. The method applies a small time varying FM signal y[k] 42, 46 which is then translated into the DPR current control word (tuning word 54) through a normalization factor represented by the term $f_R/K_{DCOT}$ (block 52). The extent of current control word variation is such that the injected signal phase θ into the LC tank varies between ±5° around a mean phase set by $\tau_{c1}$ delay line code. $K_{DCOT}$ can be determined using an algorithm illustrated in FIG. 10F and described in more detail infra, while the DCO is frequency locked by the all digital PLL (ADPLL).

Figure 10C:
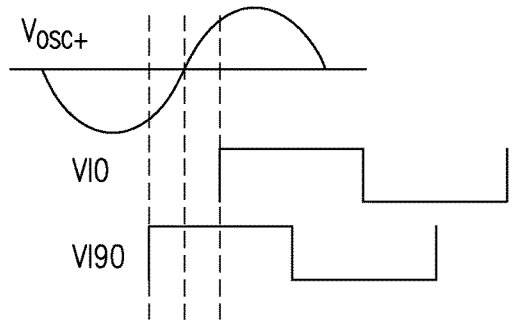
FIG. 10C is a diagram illustrating calibration of the $\tau_{c1}$ delay line when VI0/90 leads $V_{osc+}$.
Figure 10D:
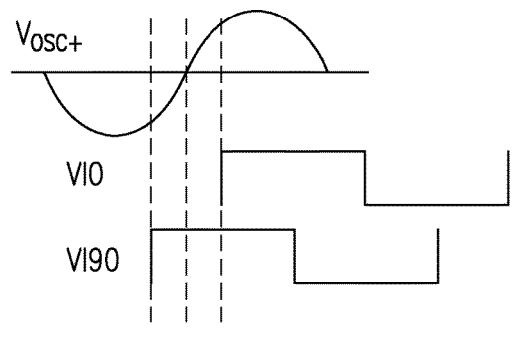
FIG. 10D is a diagram illustrating calibration of the $\tau_{c1}$ delay line when VI0/90 lags $V_{osc+}$.
Figure 10E:
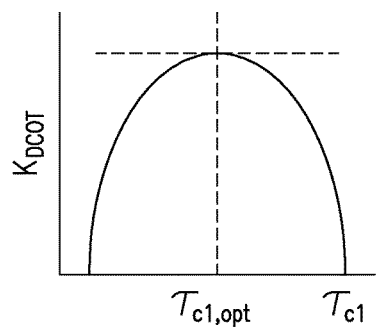
FIG. 10E is a diagram illustrating $K_{DCOT}$ as a function of $\tau_{c1}$.

Using a well-known LMS based DCO gain estimation algorithm, due to the closed-loop operation of the ADPLL, any mismatches between the digitally estimated DCO gain $K_{DCOT}$ and the actual DCO gain will result in perturbation on the filtered digital phase error (PHE) signal. In the oscillator of the present invention, $K_{DCOT}$ is adjusted until the variance of the PHE signal is minimized and the final value is then stored in a local memory. FIGS. 10B, 10C and 10D show the relationship of the oscillator signal with respect to VI0 and VI90 signals at the DPR input for three different settings of $\tau_{c1}$. The resulting $K_{DCOT}$ for each value of $\tau_{c1}$ is plotted in FIG. 10E. FIGS. 10C and 10D illustrate a scenario where $\tau_{c1}$ is not set to the optimal value, which results in the average phase between VI0 and VI90 signals to be far away from the zero crossing of the $V_{osc+}$ signal. Consequently, the $K_{DCOT}$ is low. FIG. 10B illustrates the scenario where $\tau_{c1}$ is properly calibrated and $K_{DCOT}$ is maximum. Therefore, the optimum setting of $\tau_{c1}$ is determined by performing the calibration algorithm over all settings of $\tau_{c1}$ and then storing the setting of the maximum $K_{DCOT}$ to be used during payload transmission.

Calibration Algorithm

Figure 10F:
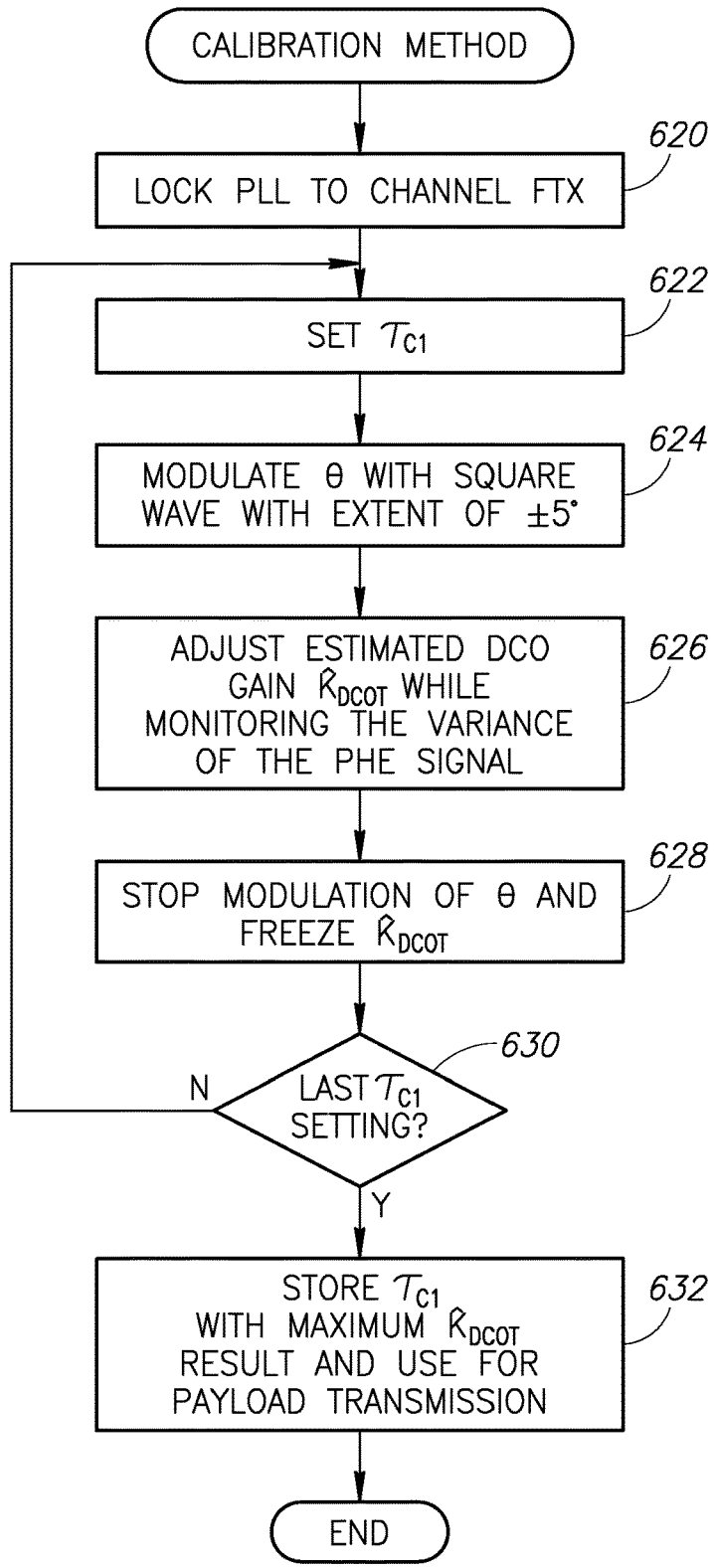
FIG. 10F is a flow diagram illustrating an example $K_{DCOT}$ calibration method for monitoring the PHE signal to optimize $\tau_{c1}$.
Figure 11:
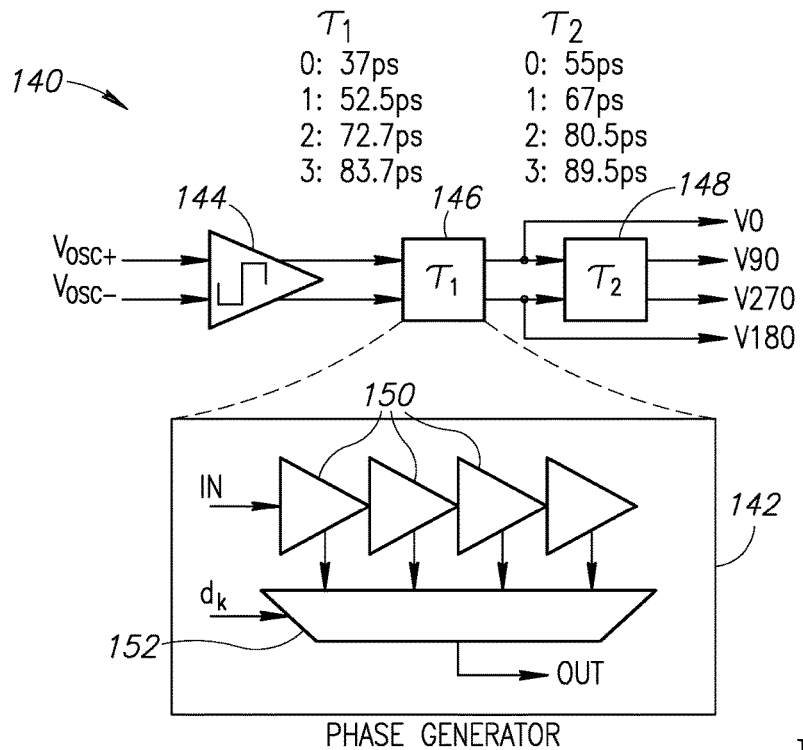
FIG. 11 is a block diagram illustrating an example phase generator of the present invention.

A flow diagram illustrating an example method of calibrating the $\tau_{c1}$ delay line is illustrated in FIG. 10F. First, the PLL is locked to channel FTX (step 620). The $\tau_{c1}$ delay line is then set (step 622). θ is then modulated with a square wave with an extent of ±5° (step 624). The estimated DCO gain $K_{DCOT}$ is adjusted while the variance of the PHE signal is monitored (step 626). The modulation of θ is stopped and the value of $K_{DCOT}$ is frozen (step 628). If it is not the last $\tau_{c1}$ setting (step 630), then the method loops back to step 622. Otherwise, $\tau_{c1}$ is stored with the maximum $K_{DCOT}$ result and is then used for payload transmission (step 632).

Performance Results

An example narrowband DCO of the present invention was implemented and fabricated by the inventors in 40-nm CMOS. In narrowband configuration, the ΣΔ dithering was turned off. The $\tau_{c1}$ delay line was manually calibrated according to the procedure described supra since the digital system required for automatic calibration was not implemented in the example fabricated silicon. The $\tau_{c2}$ setting was determined through simulations and was verified to be optimum through lab measurements. Like $\tau_{c1}$, an optimum $\tau_{c2}$ results in the highest DCO gain. The DCO step size is measured in units of Hz per degree change in θ since the transfer function is more conveniently expressed in this manner instead of the digital inputs a and b. Note that for a 6-bit word length of a and b, the approximate step size is 1°, since $\tan^{-1}(1/63)<1°$.

In the NB modulation configuration, the DPR unit cell current is 31 µA which brings the total injected current to 1.97 mA. The ratio between injection current and oscillator current $I_r$ is 0.15. A more efficient way for generating FM in this configuration is to shut off one of the interleaved DACs in the DPR and one of the quadrature phases from the phase generator. In this configuration, the frequency of the DCO is varied by modulating the amplitude of the injected signal $I_{inj}$ instead of the phase θ. This results in a substantial current savings from the DPR and the phase generator. Since the DPR unit cell current is limited by design, in order to reduce the injection strength $I_r$, $I_{osc}$ is increased to 12.8 mA. $I_{inj}$ can be varied through either control words a or b. The results with NB modulation and mean step size of 9 kHz is a total tuning range over all the DPR settings of 550 kHz. The tuning range measurement when $I_r$ is 0.32 is 80 MHz while the step size is 300 kHz. In this case both of the interleaved DACs are enabled in order to sweep the injected phase θ from −45° to 45° by setting appropriate values of the control words a and b.

The DCO phase noise at 1 MHz is −118 dBc/Hz. The far out noise is limited by the output buffer and therefore a phase noise of better than −132 dBc/Hz cannot be measured at those frequencies. The measured $1/f^3$ corner (i.e. the point along the x-axis where the slope of phase noise changes from 30 dB/dec to 20 dB/dec) is around 600 kHz.

Wideband Configuration of the Oscillator

The oscillator of the present invention was tested in wideband (WB) mode in addition to the NB mode. The results from the numerical model discussed supra show that injection locking range beyond 100 MHz is possible if the injection current is strong enough in spite of the high Q of the resonant tank required in order to meet the out-of-band noise requirements. The peak voltage $V_{osc,pk}$ curve in FIG. 5B represents a hurdle for such a task as it indicates an appreciable loss in oscillator amplitude as the oscillator is steered away from the resonant frequency of the LC tank which will consequently degrade the phase noise of the DCO. The extent, however, that degradation is somewhat dependent on the spectral density of the FM signal itself which for the WCDMA standard, for example, is somewhat Gaussian. This implies that a significant population of discrete frequencies of the modulated signal is concentrated around the carrier frequency. Therefore, the injection locked DCO, for the most part, operates close to the resonance frequency of the LC tank. Consequently, the system scarcely operates in the region of low $V_{osc,pk}$. Operating in such a way reduces any risks and prevents additional distortions that would otherwise limit the performance of the DCO.

In the wideband configuration, the DPR unit cell current is 61 µA, which brings the total injected current to 3.9 mA. The oscillator current is 5.1 mA, therefore $I_r$ is 0.75. The results are captured in FIG. 15. The mean step size is 2.88 MHz while the minimum and maximum DCO frequency is 4.522 GHz and 4.729 GHz which brings the total linear range just over 200 MHz over the injected phase range of 70°.

In addition, ΣΔ processing is required in this configuration if the frequency resolution is not adequate. A 6-bit input of the ΣΔ is swept from 0 to 63 while the integer phase boundary is between 1° and 2°. The integer step size is measured to be 1.71 MHz while the step size with ΣΔ is 24.8 kHz which is $2^{-6}$ times the integer step size. The reduction of step size with ΣΔ also improves the in-band quantization noise by 37 dB.

Figure 12:
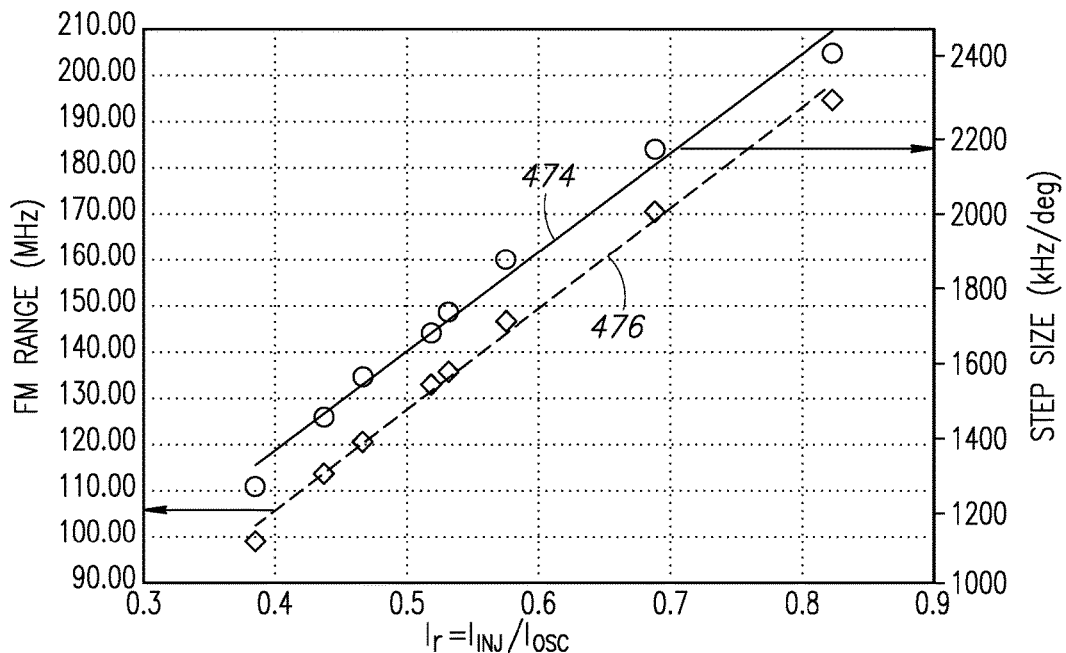
FIG. 12 is a graph illustrating injection locking range or linear FM range versus injection strength $I_r$.

An explanation will be presented of how the injection strength $I_r$ can be scaled to attain a certain linear FM range that is proportional to the injection locking range. This is achieved by measuring the linear FM range over θ as a function of $I_r$, as shown in FIG. 12. The measured step size labeled on the right y-axis represents the average step size measured by varying θ in 1° increments. The FM modulation in this measurement is strictly due to the modulation of injected phase θ. Using the NB modulation of the present invention utilizing the amplitude of injected signal, the linear FM range can be reduced to less than 1 MHz.

The measured performance of the DFC of the present invention will now be described. The measured tuning range of the DFC ranges from 550 kHz to 200 MHz at the DCO output. The step size in the WB and NB configurations is 2.88 MHz and 9 kHz respectively without ΣΔ processing, and 45 kHz and 140 Hz with ΣΔ processing. Note that the frequency resolution in the WB configuration could be improved by increasing the DPR array size. For example increasing the DPR array size to 256 elements brings the step size down to 11 kHz.

Common Source Node Injection Embodiment

The oscillator embodiment shown in FIG. 1 and described supra couples the injection signal directly into the LC tank (i.e. across the $V_{osc+}$ and $V_{osc-}$ terminals in FIG. 6, which yields the highest injection locking range and linear FM range. The downside of this topology, however, is the loading of the DCO LC tank as more current cells in the DPR are engaged, especially in the wideband configuration mode.

Figure 13A:
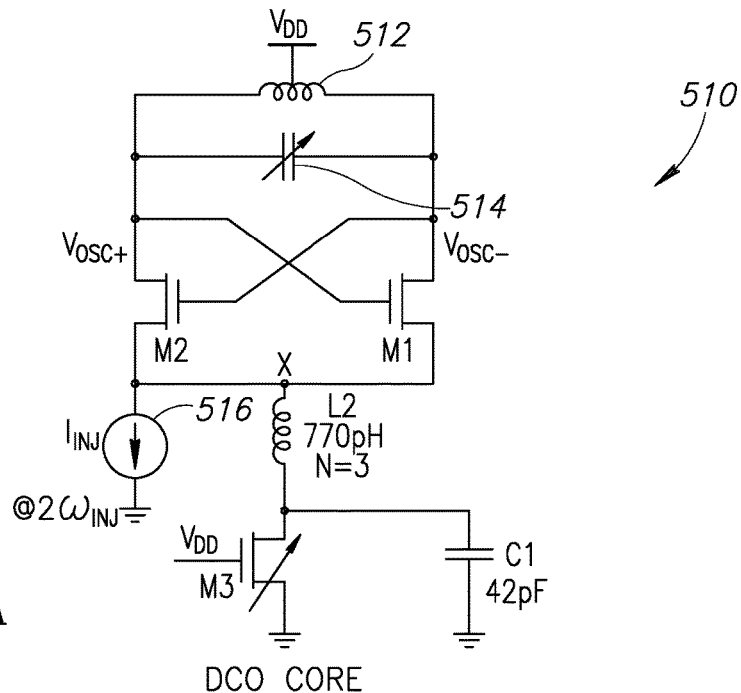
FIG. 13A is a high level schematic diagram illustrating an example DCO core circuit of a second example self injection locked oscillator of the present invention.
Figure 13B:
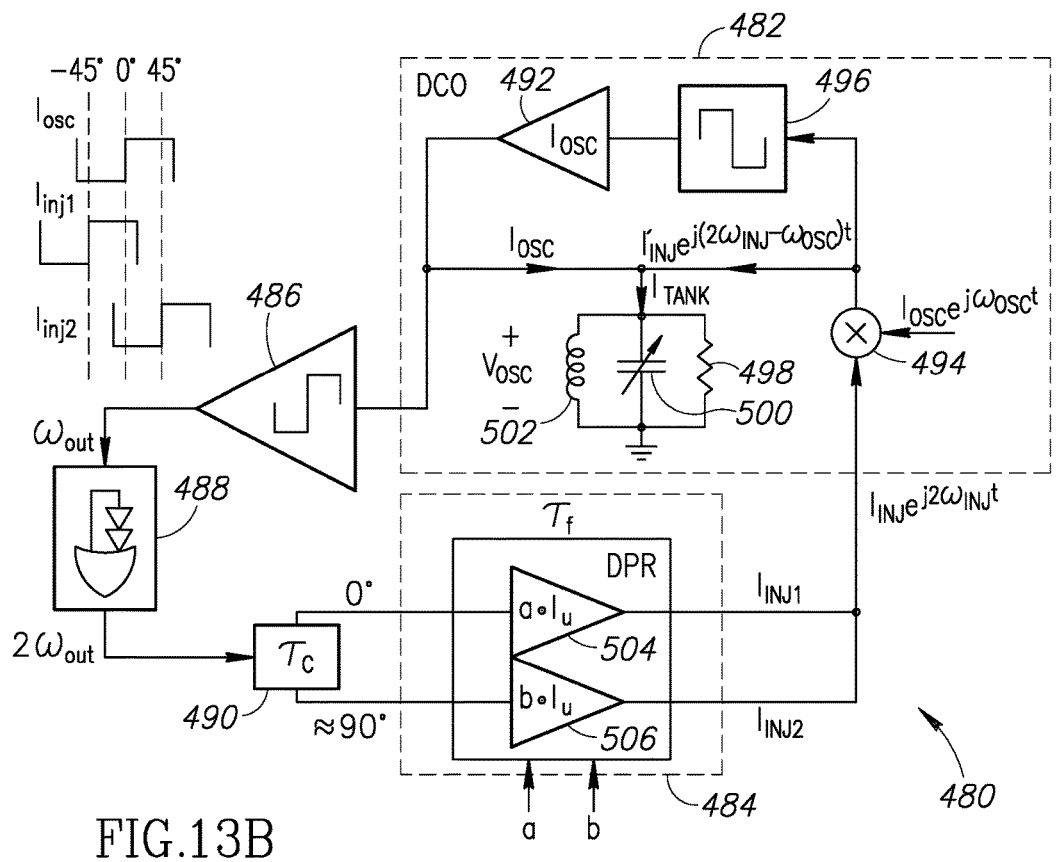
FIG. 13B is a high level schematic diagram illustrating a second example self injection locked oscillator of the present invention.

An alternative topology is shown in FIGS. 13A and 13B where the signal is injected at the common source node X of the cross-coupled NMOS transistors M1 and M2. The principal advantage in this embodiment is that the LC tank (i.e. inductor 512 and tunable capacitor 514) is free from loading by the DPR circuit. The current $I_{TANK}$ into the tank is the vector sum of the oscillator current $I_{osc}$ and the injection current $I'_{INJ} e^{j(2\omega_{INJ}-\omega_{osc})t}$. The transfer function from the common source node to the LC tank, however, is bandpass around $2\omega_o$ and therefore the DPR circuit has to operate at twice the original frequency. Therefore, a frequency doubler 488 is inserted at the DCO output to generate clocks for the DPR. Note that this topology does not require differential operation since the injected signal is single ended. The cross coupled NMOS pair acts as a mixer (494) to downconvert the injected signal into the injection locking range of the DCO.

Example Applications of the Current Switching Oscillator

Several applications of the current switching oscillator of the present invention as a frequency generator will now be described.

Figure 14:
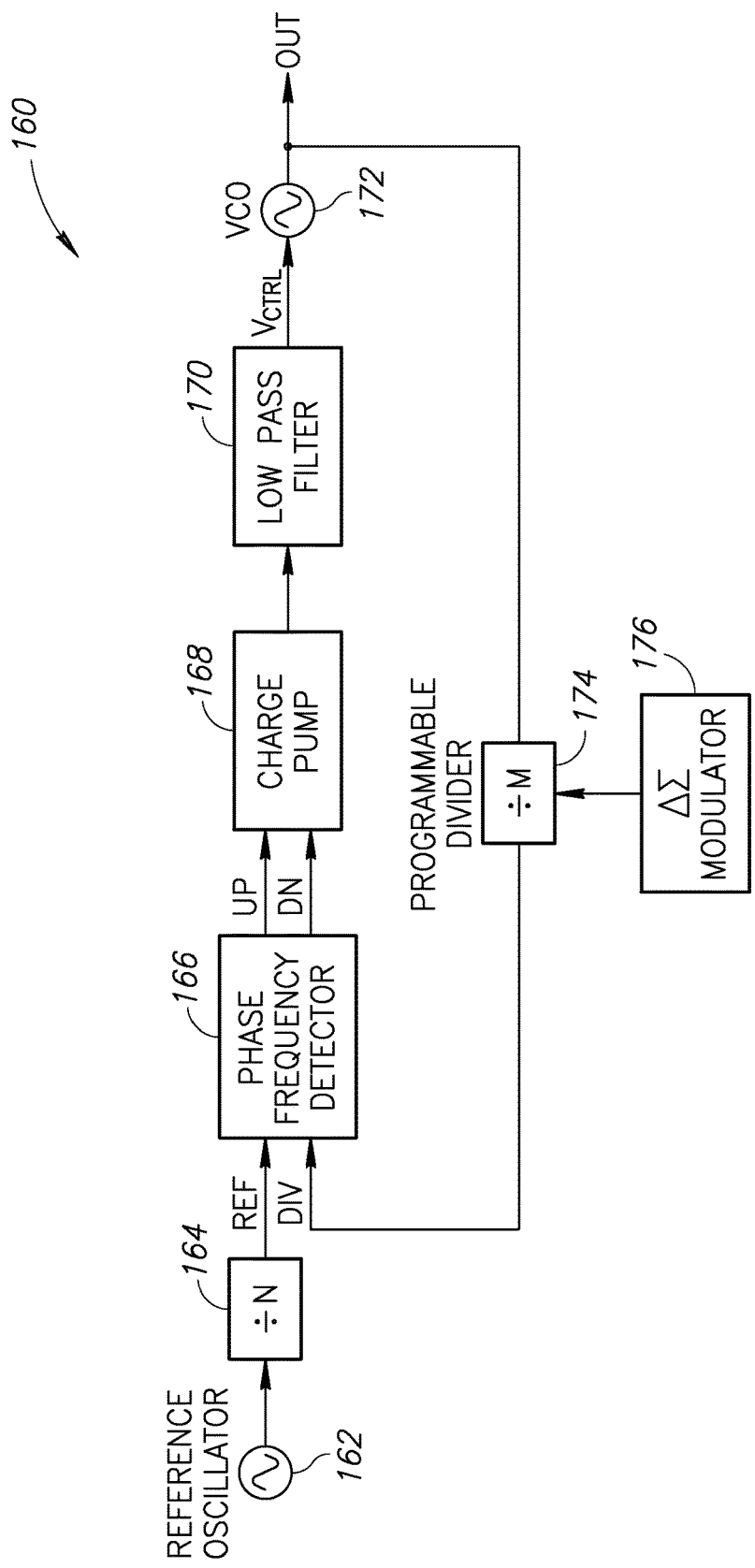
FIG. 14 is a block diagram illustrating an example phase locked loop incorporating the oscillator of the present invention.

A block diagram illustrating an example phase locked loop (PLL) incorporating the oscillator of the present invention is shown in FIG. 14. The PLL purpose is to set the oscillator at the desired channel and its operation could be entirely independent from the FM modulation using injection locking. The PLL, generally referenced 160, comprises a reference oscillator 162, ÷N divider 164, phase/frequency detector 166, charge pump 168, low pass filter 170, voltage controlled oscillator (VCO) 172 incorporating the oscillator of the present invention, programmable ÷M divider 174 and ΣΔ modulator 176.

Figure 15:
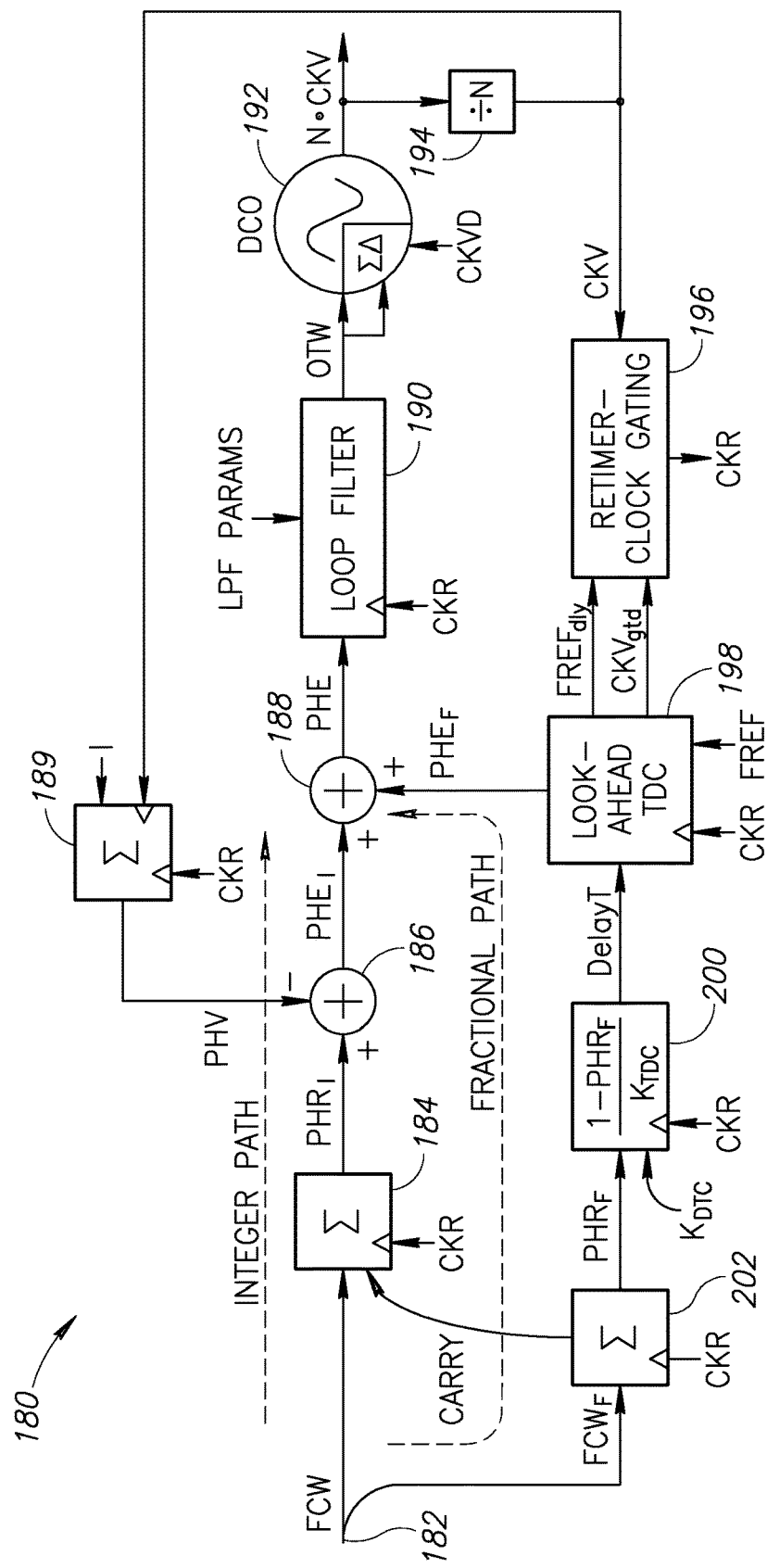
FIG. 15 is a block diagram illustrating an example all digital phase locked loop incorporating the oscillator of the present invention.

A block diagram illustrating an example all digital phase locked loop (ADPLL) incorporating the oscillator of the present invention is shown in FIG. 15. The ADPLL purpose is to set the oscillator at the desired channel and its operation could be entirely independent from or shared with the FM modulation using injection locking. The frequency command word (FCW) 182 is split into its integer $FCW_I$ and fractional $FCW_F$ parts, with separate reference accumulators 184, 202 that generate the integer and fractional part of the reference phase, $PHR_I$ and $PHR_F$, respectively. In order to properly accumulate the FCW as a whole, a carry is transferred to the integer accumulator whenever an overflow of the fractional part occurs. A synchronous 8-bit counter serves as the variable accumulator 189 and produces the variable phase PHV that is subtracted from $PHR_I$ via subtractor 186 to provide the integer part of the phase error $PHE_I$. $PHR_F$ is used to calculate the "look-ahead TDC" delay code based on the estimated delay characteristic of the look-ahead TDC (i.e., a combination of a digital-to-time converter followed by a TDC), which in turn is applied to the look-ahead TDC 198 through a gain. A look-ahead TDC gain estimation block 200, based on an iterative adaptation algorithm, is implemented on chip to dynamically track delay estimation errors due to PVT variations. The digitized output of the TDC represents the fractional part of the phase error, $PHE_F$ that is combined with $PHE_I$ via summer 188 to yield the total fixed-point representation of the phase error PHE.

The phase error PHE is then filtered via loop filter 190, in order to properly set the dynamics of the loop. A reconfigurable proportional integral controller within the loop filter block 190 is followed by a DCO decoder also within the loop filter block 190 to generate the oscillator tuning word (OTW). The DCO 192 comprises the oscillator described supra. In one embodiment, the DCO includes switched capacitor banks that are dithered using a $2^{nd}$-order MASH ΣΔ modulator in order to achieve a finer equivalent frequency resolution and push the quantization noise at higher offset frequencies where they are more easily filtered out and do not contribute significantly to the total jitter. The operation frequency of the ΣΔ modulators can be dynamically selected between different divider versions of the oscillator output in order to meet the required performance as a trade-off between power consumption and jitter.

In one embodiment, the feedback path was chosen to operate at a maximum 2.5 GHz, which means that a divideby-two version of the DCO output is fed back to the variable accumulator and the look-ahead TDC. Division by two is achieved using a current mode logic (CML) ÷4 divider cascaded with a CMOS digital divider. These dividers are represented in FIG. 15 by the ÷N block 194. Since the loop feedback operates on a divided version of the output, the effective frequency command word is adjusted accordingly. Therefore, one half of the multiplication ratio is accumulated at the ADPLL.

As mentioned supra, the retimer clock gating circuit 196 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

Figure 16:
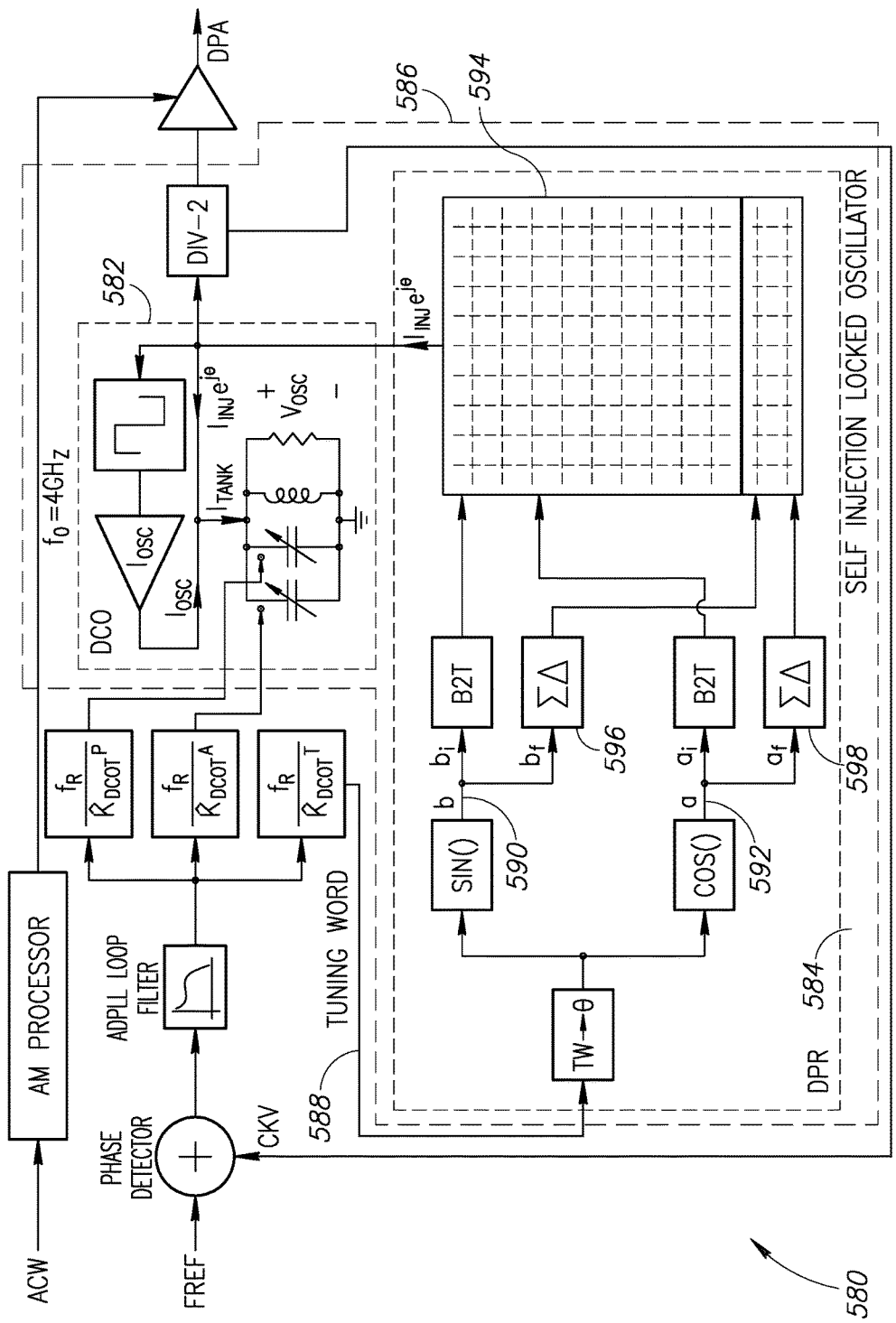
FIG. 16 is a block diagram illustrating an example polar transmitter incorporating the oscillator of the present invention.

One application of the oscillator based ADPLL of FIG. 15 is in a wideband digital polar transmitter as shown in FIG. 16. In this transmitter, generally referenced 580, the switched capacitor bank in the DCO 582 is tuned to the desired channel while the self injection locked oscillator 586 of the invention is used to perform the wideband FM modulation. The digital frequency tuning word 588 is normalized according to the calibrated DCO gain and then converted into current control inputs a 590 and b 592 to the DPR circuit 584. The integer portion of the current control is applied to the DPR array while the fractional portion is applied to the array after going through a ΣΔ modulator 596, 598.

Figure 17:
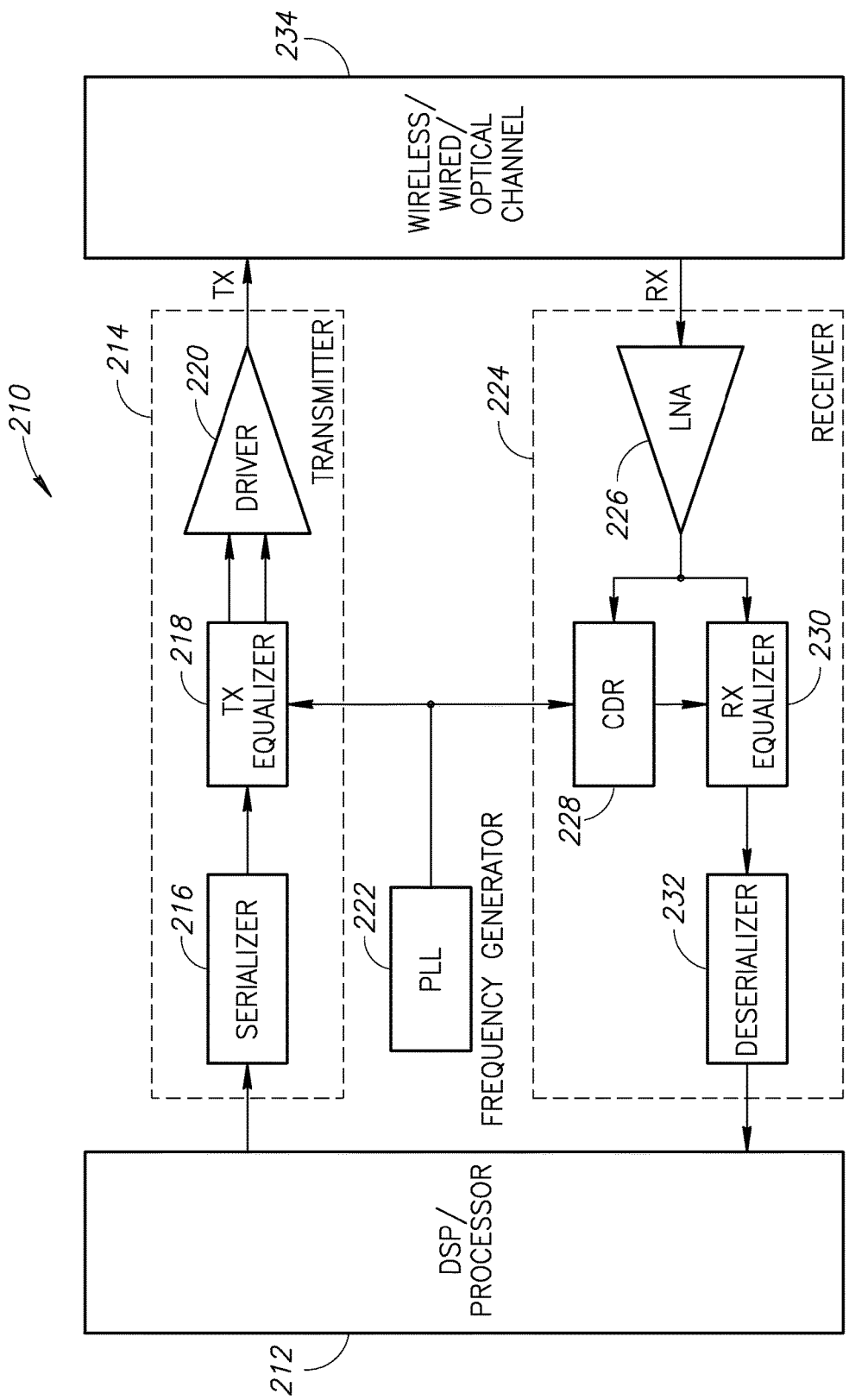
FIG. 17 is a block diagram illustrating an example wireline transceiver incorporating the oscillator of the present invention.

A block diagram illustrating an example wireline transceiver incorporating the oscillator of the present invention is shown in FIG. 17. The transceiver, generally referenced 210, comprises a DSP/processor (including a baseband processor in one embodiment) 212, transmitter 214, receiver 224, PLL based frequency generator 222 and the channel (e.g., wireline) 234. Note that a person skilled in the art can modify the transceiver 210 to operate as a wireless transceiver. The transmitter 214 comprises a serializer 216, TX equalizer 218 and driver 220. The receiver 224 comprises a low noise amplifier (LNA) 226, RX equalizer 230, clock data recovery (CDR) 228 and deserializer 232.

In this example embodiment, the frequency generator 222 comprises the self injection locked oscillator as described supra. In another embodiment, the frequency generator may comprise the ADPLL circuit described supra in connection with FIG. 15. The oscillator offers wideband frequency modulation with very fine resolution. It efficiently provides high resolution and high linearity while offering a wide tuning range which is highly desirable in wireline systems.

Mobile Device Incorporating the Injection Locked Oscillator Based DCO

Figure 18:
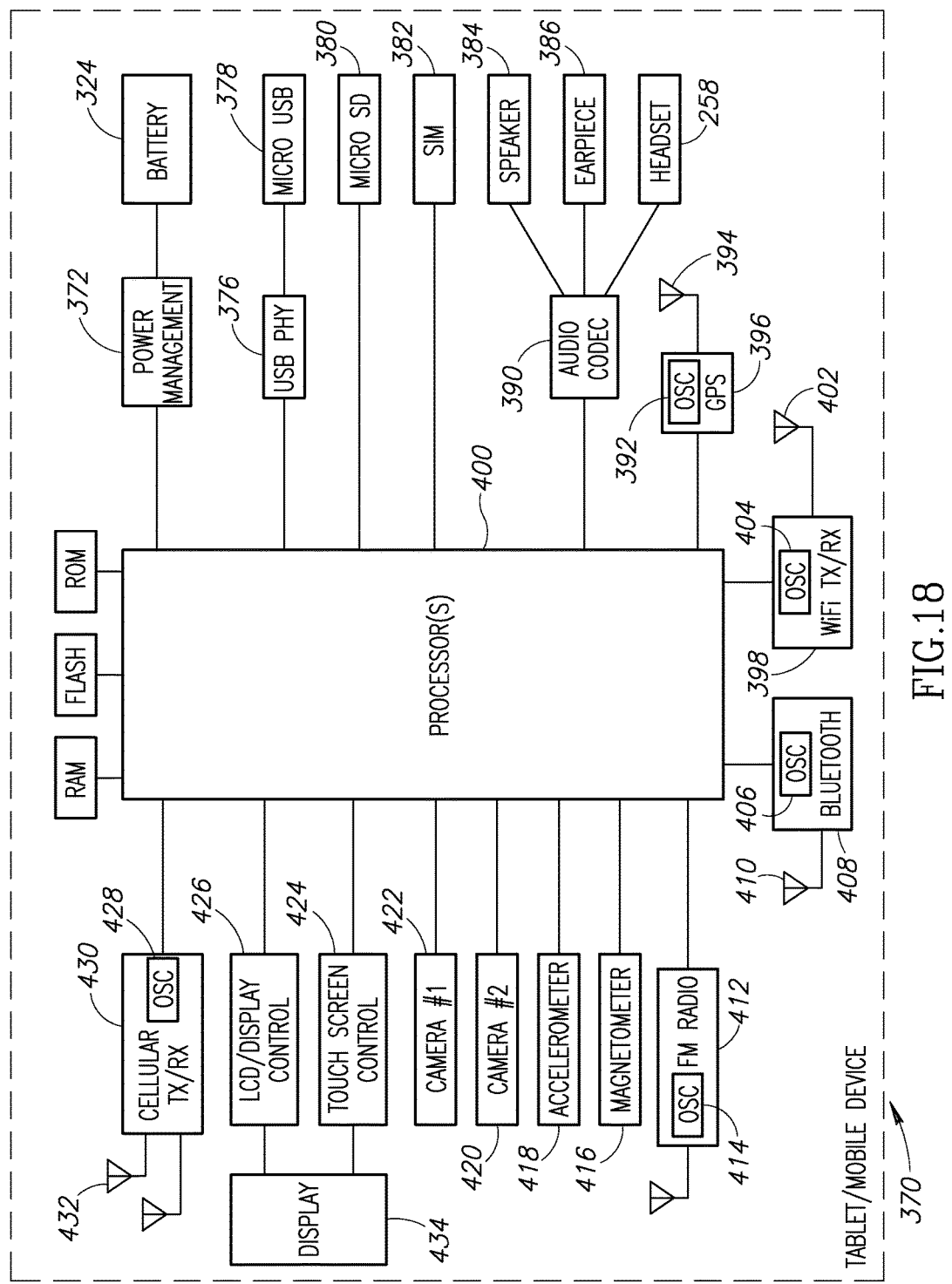
FIG. 18 is a block diagram illustrating an example mobile device incorporating the oscillator of the present invention.

A block diagram illustrating an example tablet/mobile device incorporating a frequency generator that includes the self injection locked oscillator based DCO circuit of the present invention is shown in FIG. 18. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more oscillator circuits, each incorporating the self injection locked oscillator circuit of the present invention. Numerous embodiments of the mobile device 370 may comprise an oscillator circuit 428 as described supra incorporated in the one or more cellular radios 430; as oscillator circuit 414 as described supra incorporated in the FM radio 412; an oscillator circuit 406 as described supra incorporated in the Bluetooth radio 408; an oscillator circuit 404 as described supra incorporated in the Wi-Fi radio 398; and an oscillator circuit 396 as described supra incorporated in the GPS radio 392.

Internet of Things (IoT) Node Incorporating the Current Switching Oscillator Based DCO The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 19:
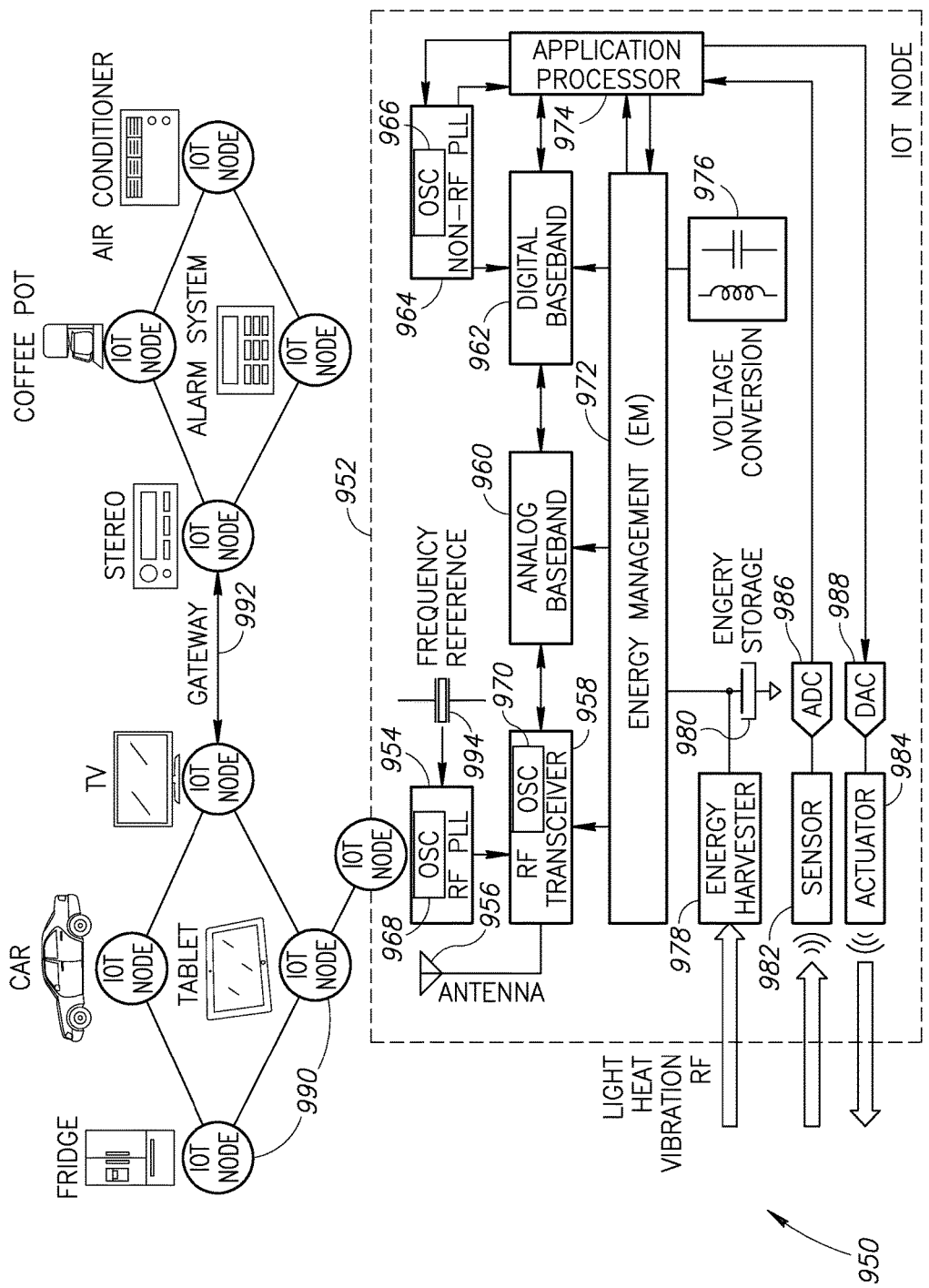
FIG. 19 is a block diagram illustrating an example IoT node incorporating the oscillator of the present invention.

A block diagram illustrating an example IoT node incorporating the oscillator of the present invention is shown in FIG. 19. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference 994 provides a fixed clock with excellent long term stability to the frequency synthesizers. In one embodiment, the oscillator of the present invention described supra is incorporated in the RF synthesizer 954 as circuit block 968; non-RF synthesizer 964 as circuit block 966; and/or RF transceiver 958 as circuit block 970.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from a battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely vary depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A frequency tuning circuit, comprising:
   a frequency oscillator incorporating an LC tank circuit and an amplifier for maintaining oscillation, said oscillator operative to generate an oscillator signal;
   an oscillator buffer adapted to receive said oscillator signal and operative to generate a clock signal therefrom;
   an auxiliary feedback loop coupled to said oscillator buffer, said auxiliary feedback loop operative to generate an injection signal having a phase and amplitude;
   said auxiliary feedback loop incorporating a phase delay circuit operative to delay said clock signal in accordance with one or more control codes to generate two substantially orthogonal currents that are vector summed to yield said injection signal, wherein a frequency of said clock signal is determined by values of said one or more control codes;
   wherein said phase delay circuit is operative to delay said clock signal without any mixing by a mixer other than with a delayed version of said clock signal;
   wherein said auxiliary feedback loop is operative to inject said injection signal into said LC tank circuit to injection lock said frequency oscillator thereby providing frequency tuning thereof in a controlled manner; and
   wherein a resonating waveform is generated across said LC tank circuit in response to a vector sum of said oscillator signal and said injection signal.

2. The frequency tuning circuit according to claim 1, wherein a free running frequency of said oscillator signal is controlled by a tunable element in said LC tank circuit.

3. The frequency tuning circuit according to claim 1, wherein said auxiliary feedback loop comprises two paths substantially orthogonal to each other.

4. The frequency tuning circuit according to claim 1, wherein said auxiliary feedback loop further comprises a frequency multiplier.

5. The frequency tuning circuit according to claim 4, wherein said frequency oscillator is operative to downconvert said injection signal.

6. The frequency tuning circuit according to claim 1, wherein said auxiliary feedback loop comprises:
   a phase generator operative to generate a coarse delayed version of said oscillator signal; and
   a digital phase rotator (DPR) circuit operative to generate a fine delayed version of said oscillator signal by interpolating said coarse delayed version of said oscillator signal.

7. The frequency tuning circuit according to claim 1, wherein the vector sum of injection currents are interpolated by said LC tank such that the vector sum is injected at a phase $\theta$ with respect to an oscillator current.

8. A method of modulating an oscillator incorporating an LC tank circuit, comprising:
   first generating an oscillator signal across said LC tank, said LC tank coupled to a transconductance amplifier for sustaining oscillations of said oscillator;
   converting said oscillator signal to a clock signal utilizing an oscillator buffer;
   second generating from said clock signal an injection signal having a phase and amplitude;
   said second generating including delaying said clock signal in accordance with one or more control codes to generate said injection signal, wherein the frequency of said injection signal is determined by values of said one or more control codes, wherein said clock signal is delayed without any mixing by a mixer other than with a delayed version of said clock signal;
   injecting said injection signal into said LC tank circuit; and
   third generating an output oscillator signal across said LC tank circuit in accordance with a vector sum of said oscillator signal and said injection signal thereby injection locking said oscillator in a controlled manner.

9. The method according to claim 8, wherein a free running frequency of said output oscillator signal is controlled by a tunable element in said LC tank circuit.

10. The method according to claim 8, wherein second generating comprises generating two substantially orthogonal signals that are injected into said LC tank circuit and interpolated thereby.

11. The method according to claim 8, further comprising converting said oscillator signal to a clock signal for input to a phase generator.

12. The method according to claim 8, wherein said method further comprises mixing a second injection signal at twice the frequency of said oscillator signal with said injection signal before injection into said LC tank circuit.

13. The method according to claim 8, wherein said injection signal comprises one or more injection currents.

14. The method according to claim 8, wherein second generating comprises fourth generating a coarse delayed version of said clock signal.

15. The method according to claim 14, wherein second generating comprises fifth generating a fine delayed version of said clock signal by interpolating said coarse delayed version of said clock signal.

16. An oscillator circuit, comprising:
   a digitally controlled oscillator (DCO) incorporating an LC tank circuit and operative to generate a resonating waveform;
   a phase generator operative to generate a coarse delayed version of said resonating waveform;
   a digital phase rotator (DPR) circuit operative to generate a fine delayed version of said resonating waveform by interpolating said coarse delayed version of said resonating waveform;
   a feedback loop coupled to said digitally controlled oscillator and said digital phase rotator circuit, said feedback loop operative to inject said fine delayed version of said resonating waveform back into said LC tank circuit; and wherein frequency of said oscillator circuit is determined by a duration said resonating waveform is delayed by said phase generator and said digital phase rotator circuit.

17. The oscillator circuit according to claim 16, wherein frequency of said resonating waveform of said digitally controlled oscillator is controlled by a tunable element in said LC tank circuit.

18. The oscillator circuit according to claim 16, further comprising an oscillator buffer operative to convert the resonating waveform generated by said digitally controlled oscillator to a square wave clock for input to said phase generator.

19. The oscillator circuit according to claim 16, wherein said phase generator is operative to generate first and second output clocks having an approximately quadrature phase relationship.

20. The oscillator circuit according to claim 16, wherein said coarse delayed version of said resonating waveform is doubled in frequency compared to said fine delayed version of said resonating waveform.

* * * * *